(12) United States Patent
Flock et al.

(10) Patent No.: US 7,479,710 B2
(45) Date of Patent: Jan. 20, 2009

(54) ELECTRICAL SUPPLY NETWORK

(75) Inventors: Horst Flock, Reutlingen (DE); Thomas Kanamueller, Esslingen (DE); Joerg Ehrhardt, Nuertingen (DE)

(73) Assignee: AFL Europe GmbH, Frickenhausen (DE)

( * ) Notice: Subject to any disclaimer, the term of this patent is extended or adjusted under 35 U.S.C. 154(b) by 264 days.

(21) Appl. No.: 11/031,474

(22) Filed: Jan. 6, 2005

(65) Prior Publication Data

US 2006/0017445 A1   Jan. 26, 2006

(30) Foreign Application Priority Data

Jan. 9, 2004 (DE) ........................ 10 2004 001 403
Aug. 13, 2004 (DE) ........................ 10 2004 041 008

(51) Int. Cl.
*B60L 1/00* (2006.01)
(52) U.S. Cl. ........................................ 307/9.1
(58) Field of Classification Search .................... 307/9.1
See application file for complete search history.

(56) References Cited

U.S. PATENT DOCUMENTS 5,808,371 A * 9/1998 Kon'i et al. ................. 307/10.1
6,049,139 A   4/2000 Nagaura et al.

FOREIGN PATENT DOCUMENTS

| DE | 37 31 537 | 3/1989 |
|---|---|---|
| DE | 38 86 011 | 12/1993 |
| DE | 691 10 177 | 6/1995 |
| DE | 100 19 430 | 10/2001 |
| EP | 0 317 101 | 12/1993 |
| EP | 0 450 808 | 6/1995 |
| EP | 0 812 049 | 12/1997 |
| EP | 1 286 429 | 2/2003 |
| WO | 03/032445 | 4/2003 |

* cited by examiner

*Primary Examiner*—Robert L. Deberadinis
(74) *Attorney, Agent, or Firm*—Lipsitz & McAllister, LLC

(57) ABSTRACT

In order to improve an electrical supply network for on-board electrical systems of vehicles, comprising at least one network system with a current feed-in connection, with at least one load connection and with a supply line system which is guided from the current feed-in connection to the at least one load connection and has at least one current-carrying line harness and at least one protective casing surrounding this, in such a manner that an electric arc can either be avoided or when an electric arc is formed this can be terminated again as quickly as possible, it is suggested that the supply line system be provided with a detector line system which is connected at a first end to a detector circuit and is connected at at least one additional end to an end element, that the detector circuit generate a test signal which is influenced in the defect-free state by the detector line system and the end element and that the detector circuit detect a defect due to deviation of the test signal from a reference value range corresponding to the defect-free state.

53 Claims, 21 Drawing Sheets

$t_1$ $t_2$ $t_3$  $t_4$ $t_5$ $t_6$ $t'_1$  $t'_n$  $t'_m$  $t'_z$

ELECTRICAL SUPPLY NETWORK

The present disclosure relates to the subject matter disclosed in German application number 10 2004 001 403.5 of Jan. 9, 2004 and German application number 10 2004 041 008.9 of Aug. 13, 2004, which are incorporated herein by reference in their entirety and for all purposes.

The invention relates to an electrical supply network for on-board electrical systems of vehicles of all types, i.e., land, air and water vehicles, in particular, for on-board electrical systems of motor vehicles, comprising at least one network system with a current feed-in connection, with at least one load connection and with a supply line system which leads from the current feed-in connection to the at least one load connection and has at least one current-carrying line harness and at least one protective casing surrounding it.

Supply networks of this type are known from vehicle technology.

If, however, the supply line system is operated with voltages which are above 12 volts, preferably above 20 volts, often even above 30 volts, there is a latent risk potential when the current-carrying line harness is interrupted, for example, by an unintentional disconnection at a releasable connection or by a defect or when the protective casing is damaged since a respective electric arc, which represents a considerable risk of fire on account of the current intensities normally available, can then be formed across the defect of the current-carrying line harness or proceeding from the current-carrying line harness to any optional part of the vehicle, in particular, to a part of the vehicle connected to ground.

The object underlying the invention is therefore to improve a line arrangement of the generic type in such a manner that an electric arc can either be avoided or when an electric arc is formed this can be terminated again as quickly as possible.

This object is accomplished in accordance with the invention, in the case of an electrical supply network of the type described at the outset, in that the supply line system is provided with a detector line system which is connected at a first end to a detector circuit and is connected at at least one additional end to an end element, that the detector circuit generates a test signal which is influenced by the detector line and the end element in the defect-free state and that the detector circuit detects a defect due to deviation of the test signal from a reference value range corresponding to the defect-free state.

The advantage of the solution according to the invention is to be seen in the fact that with it it is possible to check the defect-free state of the supply line system not only via the influence of the detector line system on the test signal but also, at the same time, via the influence of the end element which is arranged at an end of the detector line system remote from the detector circuit and exerts a defined influence on the test signal.

The detector circuit could, in principle, be designed such that it merely generates a defect report when a defect is detected.

For reasons of optimum safety it is preferably provided for the detector circuit to trigger a disconnection of the supply line system from the current source when a defect is detected.

Such a disconnection may be realized in the most varied of ways either directly or indirectly.

For example, such a disconnection could be carried out via a data bus system of the vehicle itself or via an additional, interconnected safety system.

A particularly reliable solution provides for the detector circuit to activate a disconnection circuit for the separation of the supply line system from the current source, i.e., for a direct activation of the disconnection circuit to be brought about without, where applicable, any additional, interconnected safety systems.

In conjunction with the solution described thus far it is assumed that at least one additional end of the detector line system is provided with an end element.

Particularly when several additional ends of the detector line system are provided, an end element is expediently provided at each of the additional ends in order to monitor the detector line system insofar as an interruption of the detector line system can be detected each time in the section of the detector line system leading to the respective end.

In order to monitor the current-carrying line harness essentially completely, it is preferably provided for the detector line system to extend in an electrically insulated manner in relation to the current-carrying line harness and to essentially follow the line harness so that electric arcs propagating from the line harness can be detected via the detector line system.

In this respect, the detector line system is designed, in particular, such that it alters its electrical properties irreversibly when a local electric arc proceeding from the current-carrying line harness occurs.

The current-carrying line harness may be monitored particularly advantageously when the detector line system extends along the current-carrying line harness.

The current-carrying line harness may be monitored particularly advantageously when the detector line system extends essentially around the current-carrying line harness.

With respect to the dimensioning of the end element, no further details have been given in conjunction with the preceding explanations. The requirement was merely that the end element should influence the test signal so that any shorting out of the end element, for example, can be detected via a deviation from the reference value of the test signal.

It is particularly advantageous when the end element influences the test signal in the defect-free state to a greater extent than the detector line system so that the test signal is influenced primarily by the end element and, as a result, its undisturbed presence and, therefore, the continuous functionality of the detector line system can be recognized reliably.

It is particularly favorable when the end element influences the test signal to a greater extent than the detector line system by at least a factor of 10.

It is even better when the end element influences the test signal to a greater extent than the detector line system by at least a factor of 50, even better a factor of 100.

In the simplest case, the end element is designed such that it comprises an electrical resistor which influences the test signal by means of its electrical properties.

An electrical resistor of this type is to be understood not only as an ohmic resistor but rather as any type of electrical resistor, i.e., not only an ohmic resistor but also a capacitive or an inductive resistor or a combination of all these possibilities.

In order, in addition, to be able to generate further defect reports via the end element, it is preferably provided for the end element to comprise an electrical switch.

An electrical switch of this type offers the possibility of reporting additional defect states to the detector circuit via the detector line system in addition to the monitoring of the detector line system.

One advantageous embodiment provides for the electrical switch to represent a status indicator for defects of a connection of the supply line system to subsequent units.

Subsequent units of this type may be, for example, load units or other electrical units or also additional network systems.

In the simplest case, it is provided for the electrical switch to be mechanically controllable and, therefore, to offer the possibility, for example, of checking a mechanical connection to a subsequent unit, for example, a plug connection.

Another advantageous possibility provides for the electrical switch to be electrically controllable and, as a result, it is possible to detect electrically detectable states in the following units.

A favorable solution provides for the voltage supplied to the following unit via the current-carrying line harness to be detected in order to be able to recognize, for example, defects in the line harness itself as a result.

Another possibility is for the defects of a following network system to likewise be detectable by the preceding network system as a result of the electrical activation of the switch via a detector circuit.

With respect to generating the test signal, no further details have been given in conjunction with the preceding embodiments.

In principle, the test signal can be generated in the most varied of ways and be evaluated by the detector circuit in the most varied of ways.

A solution which is particularly advantageous on account of its simplicity provides for the detector circuit to detect with the test signal an electrical resistance formed by the detector line system and the end element.

The electrical resistance could, in this respect, be detected, for example, within the scope of a closed line loop. In the case of on-board electrical systems of vehicles it is, however, particularly favorable on account of its simplicity when the detector circuit detects the electrical resistance in relation to ground.

In the simplest case, the end element is, therefore, arranged between the second end of the detector line system and ground.

The test signal may be generated particularly easily with the solution according to the invention when it can be generated by a voltage divider.

In this respect, the voltage divider is preferably designed such that the end element is an element of the voltage divider.

In addition, it is advantageous when the detector line system is an element of the voltage divider.

Furthermore, it is expediently provided for the detector circuit to comprise a first branch of a voltage divider leading from the first end of the detector line system to a voltage supply for generating the test signal.

A circuit of this type for generating the test signal can be realized in a particularly simple manner.

Furthermore, it is favorable when the end element and the detector line system form a second branch of the voltage divider so that the end element and the detector line system contribute directly to determining the test signal and every alteration in the area of the detector line system or of the end element in the sense of an interruption or a short circuit significantly alters the test signal.

In this respect, it is particularly favorable when the second branch of the voltage divider is located between the first end of the detector line system and ground in order to be able to detect, in particular, every connection between the detector line system and ground directly as a significant influence on the test signal.

With a voltage divider of this type it is particularly favorable when the voltage is monitored at the first end of the detector line as test signal.

This may be realized particularly easily when the detector circuit comprises with a monitoring circuit when voltage thresholds are exceeded or not reached.

In this respect, it is particularly favorable when the detector circuit monitors the voltage with the monitoring circuit with respect to an upper voltage threshold being exceeded and a lower voltage threshold not being reached.

With respect to the test signal, it is not determined even when measuring voltages whether these are intended to be direct voltages or alternating voltages.

Both possibilities are conceivable within the scope of the solution according to the invention.

A first possibility, for example, provides for the test signal to be a direct voltage signal which is simple to generate.

Such a direct voltage signal is, in the simplest case, a direct voltage signal with a single direct voltage potential.

It is, however, also conceivable for the test signal to comprise several direct voltage potentials.

When several direct voltage potentials are provided, these may preferably be applied one after the other.

Such a sequence of direct voltage signals need not necessarily be brought about with a specific duration or a specific frequency. It is also conceivable to apply direct voltage potentials of this type stochastically one after the other.

It is particularly favorable when a changeover between the direct voltage potentials takes place during a monitoring period of time.

Furthermore, the monitoring circuit is preferably to be adapted to the type of test signal.

In the case of a constant direct voltage potential, the monitoring circuit is to be designed such that this detects the direct voltage potential itself constantly or in the monitoring periods of time provided.

Particularly in the case of several direct voltage potentials, it is, however, favorable when the monitoring circuit evaluates differences between the direct voltage potentials.

An additional, favorable solution provides for the monitoring circuit to evaluate a course of the direct voltage potentials.

Such an evaluation of the course of the direct voltage potentials provides, for example, for this to evaluate durations or also periods of time of a high phase or a low phase of the direct voltage potentials.

A particularly favorable solution provides for the monitoring circuit to evaluate flanks of any change in the direct voltage potentials.

Within the scope of the idea according to the invention, another favorable solution provides for the test signal to be an alternating voltage signal, wherein it is particularly favorable when the test signal is a high frequency alternating voltage signal since, in this case, it is possible not only to detect the voltage thereof but also to evaluate frequency parts and, where applicable, the frequency parts in addition to the voltages.

One particularly expedient embodiment of the solution according to the invention provides for the detector line system and the at least one supporting element to form an oscillating circuit so that the course of the frequency of the test signal can be evaluated.

For this purpose it is provided, for example, for the monitoring circuit to evaluate frequency components of the test signal.

Such an evaluation of frequency components of the test signal may be carried out particularly favorably when the monitoring circuit detects the frequency components via band filters.

With respect to the design of the detector circuit itself, no further details have been given in conjunction with the preceding explanations concerning the invention. One advantageous embodiment provides, for example, for the detector circuit to have a monitoring circuit with a learning mode, in which the reference value range for the test signal can be determined.

As a result, an adjustment to the actual extension of the detector line system and the end elements may be carried out for each supply network in accordance with the invention.

This is of advantage not only in the case of a direct voltage signal as test signal but also, in particular, in the case of high frequency test signals since the capacitive and inductive influences are difficult to determine with the necessary precision within the scope of the production.

Furthermore, it is particularly favorable when the control circuit determines the reference value range proceeding from a measurement value for the test signal in the case of a defect-free detector line system with the at least one end element.

The determination of the reference value range is not possible during a measurement of the test signal.

Expediently, the reference value range can therefore be determined by means of a reference value bandwidth specified to the monitoring circuit.

The invention relates, in addition, to an electrical supply network for on-board electrical systems of vehicles, comprising at least one network system with a current feed-in connection and at least one load connection and with a supply line system which leads from the current feed-in connection to at least one load connection and has at least one current-carrying line harness and releasable power contact elements for the current-carrying line harness.

Proceeding from an electrical supply network of this type, the object specified at the outset is accomplished in accordance with the invention in that a monitoring line system is provided which has at least one monitoring line and releasable monitoring contact elements in the monitoring line, that the monitoring contact elements are coupled to the power contact elements in such a manner that a release of the monitoring contact elements takes place at the latest with a release of the power contact elements or prior thereto and that a monitoring circuit is provided which monitors the monitoring line system by means of a test signal and interrupts a flow of current through the current-carrying line harness by means of a switch-off device when monitoring contact elements are released.

The advantage of this solution is to be seen in the fact that, with it, no unintentional releasing of the power contact elements in the case of a current-carrying line harness can occur and so any formation of a light arc can also be prevented when the power contact elements are released.

An additional advantage of this solution is to be seen in the fact that the current-carrying part of the line harness is switched to voltage-free and, therefore, inadmissibly high contact voltages can be avoided.

It is particularly favorable when the monitoring contact elements are arranged in such a manner that the power contact elements can be released only when the monitoring contact elements are already contact-free in relation to one another.

This solution has the great advantage that, with it, it is already ensured in any case prior to any release of the power contact elements that the flow of current through the current-carrying line harness is interrupted.

Such an embodiment may be realized particularly favorably from a mechanical point of view when the monitoring contact elements mechanically block any release of the power contact elements in their contact-making position.

Such a mechanical blocking could, in principle, be achieved in that the power contact elements and the monitoring contact elements are not integrated into a common unit but are rather provided in two separate units but the unit with the monitoring contact elements is designed such that this prevents any release of the unit, in which the power contact elements are integrated.

This is possible, for example, due to the fact that the units are coupled in such manner that even a release of the unit with the power contact elements already leads prior thereto to a release of the unit for the monitoring contact elements.

In principle, the contact elements can also be designed as screw contact elements or contact elements releasable in a different way.

A particularly favorable embodiment provides, however, for the monitoring contact elements to be designed as elements of a plug contact since they may easily be released and, therefore, it may be ensured in a simple manner that a release of the monitoring contact elements is always brought about in good time prior to any release of the power contact elements.

On the other hand, it is, however, also expedient when the power contact elements are also designed as elements of a plug contact on account of the easy releasability.

It is, however, particularly favorable when both one of the power contact elements and one of the monitoring contact elements are arranged in one plug connector element and the other one of the power contact elements and the other one of the monitoring contact elements are arranged in the other plug connector element so that a mechanical interconnection between the positions of the power contact elements and the monitoring contact elements relative to one another can already take place on account of this arrangement and it can be ensured solely on account of the positioning of the power contact elements relative to the monitoring contact elements, in particular, their extension in plug-in direction that the monitoring contact elements are likewise disconnected from one another at the latest when the power contact elements are disconnected but, as far as possible, the monitoring contact elements are disconnected from one another prior to any disconnection of the power contact elements and, on the other hand, the monitoring contact elements are again connected electrically to one another at the earliest when the power contact elements are connected but, as far as possible, the monitoring contact elements are not connected electrically to one another until after an electrical connection of the power contact elements.

Alternatively or in addition to the solutions described above, it has proven to be favorable, in particular when the plug connector elements are fixed relative to one another by means of mechanical locking, when the monitoring circuit monitors a mechanical connection of the plug connector elements and interrupts a flow of current through the current-carrying line harness by means of a switch-off device when a mechanical connection is released.

The advantage of this solution is to be seen in the fact that, with it, a monitoring of the mechanical position of the plug connector elements relative to one another can already take place.

One possibility is to monitor purely the relative position of the plug connector elements relative to one another.

Another, advantageous possibility provides for the monitoring circuit to monitor a locking device of the plug connector elements and to already interrupt the flow of current through the current-carrying line harness upon release of the locking device without any release of the plug connector elements having begun.

Such a monitoring of the mechanical connection of the plug connector elements may take place alternatively or in addition to the monitoring of a monitoring line or also of the detector line system.

For example, it is also conceivable to provide such a monitoring of the mechanical connection of the plug connector elements independently of the detector line system or of the monitoring line and to allocate this to the respective component, on which the plug connector is arranged.

It is, however, just as conceivable to integrate the monitoring of the mechanical plug connection in the overall monitoring.

It is particularly advantageous within the scope of the solution described when the monitoring line system is identical to the detector line system so that the monitoring circuit provided in the detector circuit can also be used as monitoring circuit.

It is, however, also conceivable to provide, in addition to the monitoring circuit provided in the detector circuit, additional monitoring circuits which work independently of this.

Additional features and advantages of the invention are the subject matter of the following description as well as the drawings illustrating several embodiments.

Figure 1:
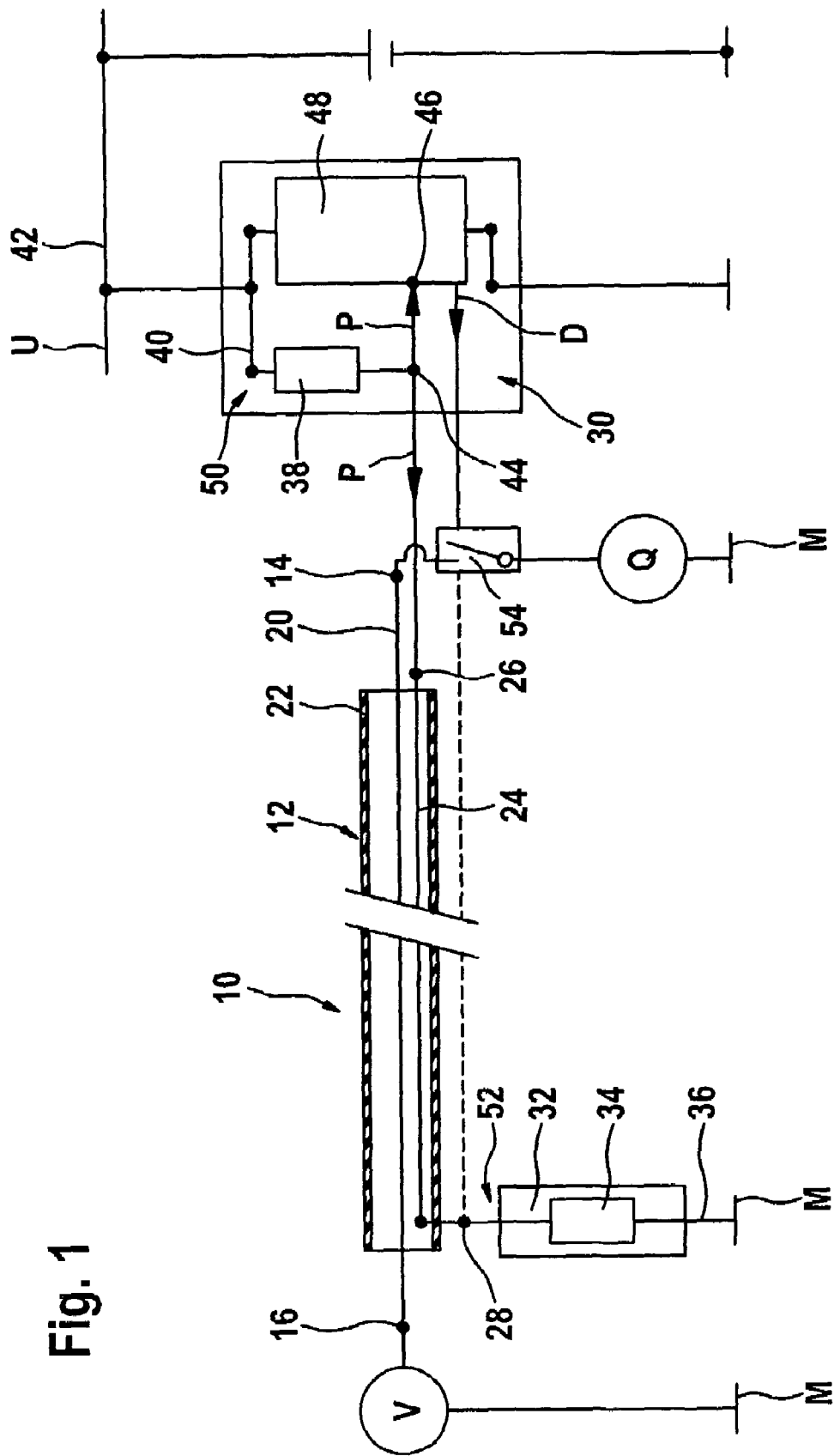
FIG. 1 shows a circuit diagram of a first embodiment of a supply network according to the invention.

A first embodiment of an electrical supply network, with a network system designated in FIG. 1 as a whole as 10, in particular, a current supply network for on-board electrical systems of vehicles, preferably motor vehicles, serves to feed current from a current source Q to a load device V.

For this purpose, the electrical network system 10 comprises a supply line system 12 which is connected to the current source Q via a current feed-in connection 14 and is connected to the load device V via at least one load connection 16.

In the case of on-board electrical systems of vehicles, in particular, motor vehicles, both the current source Q and also the load device V are connected, on the one hand, to ground M so that the supply line system 12 merely requires one current-carrying line harness 20 which is guided from the current feed-in connection 14 to the load connection 16.

In this respect, the line harness 20 is surrounded for the purpose of its electrical insulation by a protective casing 22 (e.g., a protective shield) which insulates it in relation to the surroundings and in the case of vehicles, in particular, motor vehicles also in relation to the bodywork and, consequently, in relation to ground.

Particularly in all the cases, in which the line harness 20 is operated with voltages which are above 12 volts, preferably above 20 volts, there is a latent risk potential in the case of defects of the line harness 20 itself or defects in the protective casing 22 that an electric arc can be formed in such a case which, for its part, represents a considerable risk of fire.

For this reason, a detector line system 24 is associated with the supply line system 12 and this has, for example, a detector line 25 which extends essentially along the line harness 20 in the supply line system 12 and can, for example, also extend around it in the most varied of ways.

The detector line system 24 and the detector line 25 may be designed, for example, in the way described in detail in DE 102 34 389.6-34 or in EP 03 016 367.9. For this reason, reference is made in full in this respect to the explanations contained in these applications.

The detector line system 24 associated with the supply line system 12 has a first end 26 as well as a second end 28 which are located close to the respective connections 14, 16 of the supply line system 12 and are allocated, in particular, to these connections 14, 16.

In accordance with the invention, the first end 26 is connected to a detector circuit designated as a whole as 30. The additional end 28 is, for its part, connected to an end element which is designated as a whole as 32 and, for its part, is located in the simplest case in a connection line 36 between the additional end 28 of the detector line system 24 and the ground M.

The electrical resistance of the end element 32 is preferably selected as a whole such that it is greater than the electrical resistance of the detector line system 24 between the first end 26 and the additional end 28 by at least a factor of 10, even better by a factor of 50 and particularly expediently by a factor of 100.

The detector circuit 30 likewise comprises, for its part, an electrical resistor 38 which is arranged in a connection line 40 between a voltage supply 42 and a central tap 44.

The central tap 44 is, for its part, connected directly to the first end 26 of the detector line system 24 and, in addition, connected to an input 46 of a monitoring circuit 48.

The connection line 40 and the electrical resistor 38 therefore form a first branch 50 of a voltage divider located between the voltage supply 42 and ground while the detector line system 24 forms a second branch 52 of this voltage divider together with the connection line 36 and the end element 32 arranged in it, wherein both branches 50, 52 influence a test signal P resulting at the central tap 44.

In the simplest case, the electrical resistors 34 and 38 are ohmic resistors so that when a direct voltage U is applied at the voltage supply 42 the test signal P corresponds to the electrical potential between the direct voltage U and ground M which results at the central tap.

This direct voltage potential is also present at the input 46 to the monitoring circuit 48 and can therefore be detected by it.

Figure 2:
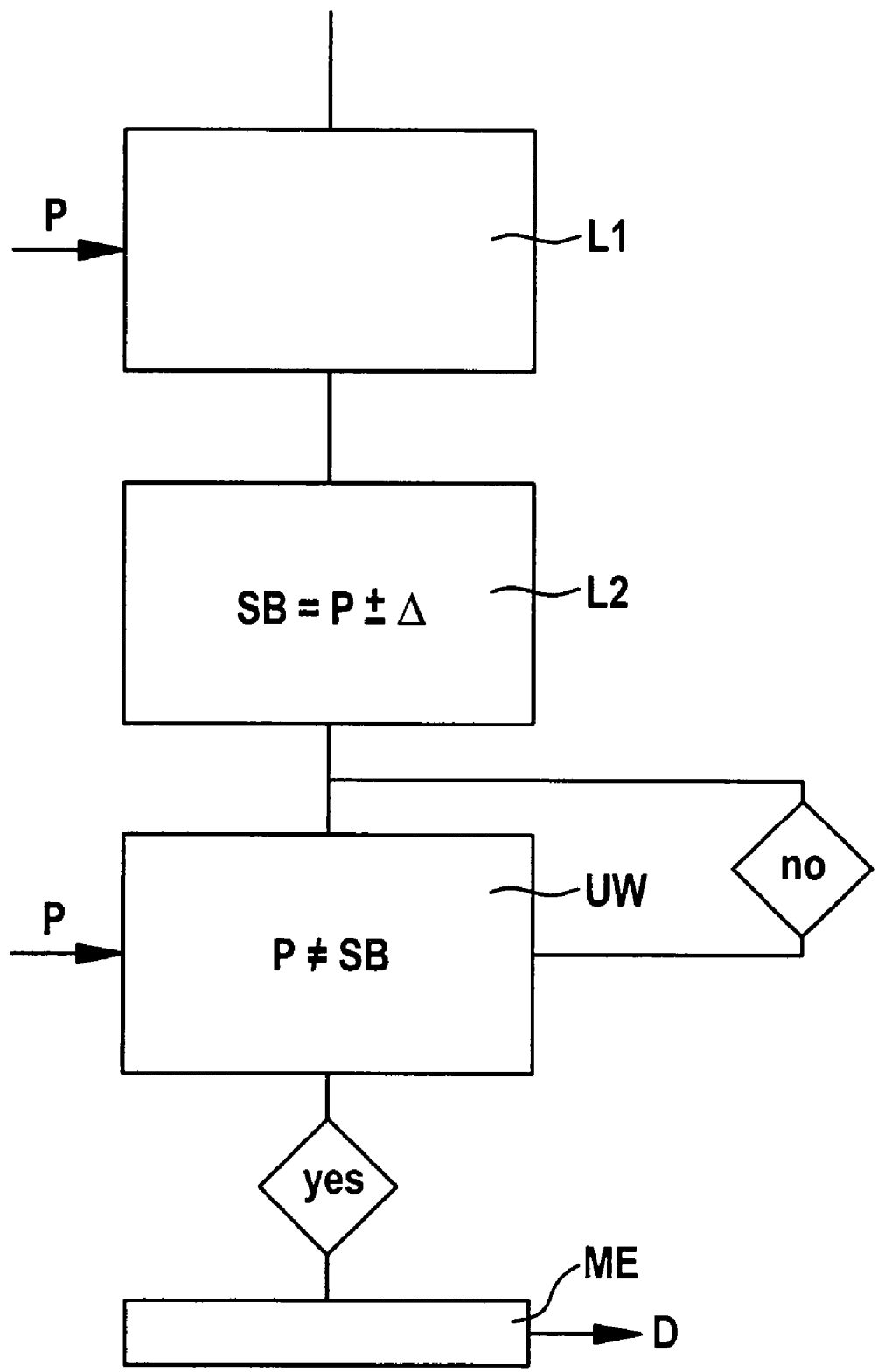
FIG. 2 shows a schematic illustration of one function of a monitoring circuit.
Figure 3:
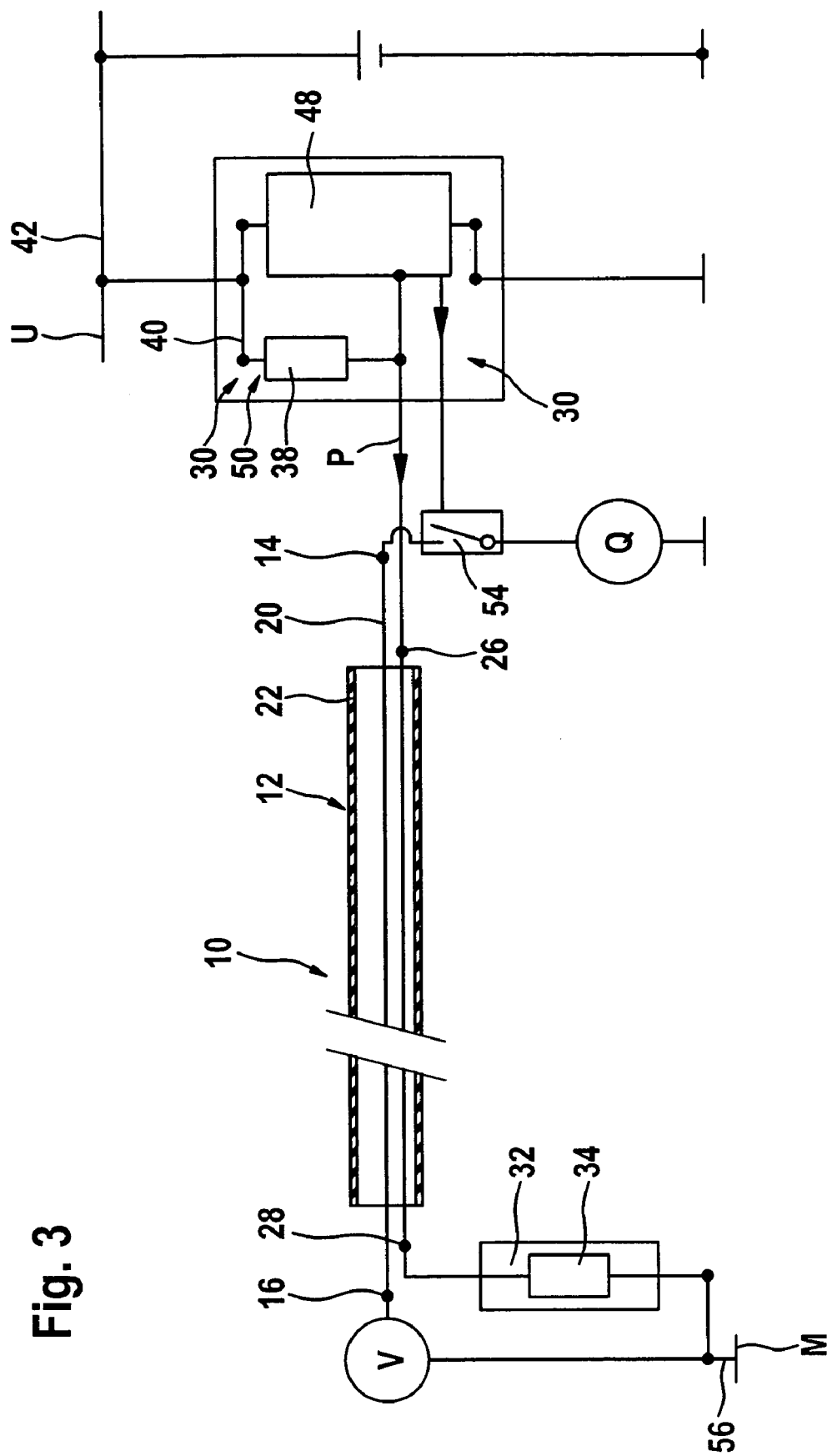
FIG. 3 shows a circuit diagram of a second embodiment.

In order to obtain a reliable monitoring of the supply line system 12, the monitoring circuit 48 is designed such that it is operated first of all in a learning mode illustrated in FIG. 2.

In the learning mode, the test signal P is read in in a first step L1, in the implest case the potential occurring at the central tap 44.

In a second step L2 of the learning mode, a reference value range SB is calculated which may be calculated from the potential P and a fluctuation width Δ admissible in addition to the potential P.

If the reference value range SB is determined in the step L2 of the learning mode, the monitoring circuit 48 transfers into a monitoring mode UW which is illustrated in FIG. 2 and in which the test signal is constantly monitored, namely to see whether this is within the reference value range SB or outside it.

If the test signal P is within the reference value range SB, the monitoring circuit 48 remains in the monitoring mode UW and continues to monitor the test signal P.

If the test signal P is outside the reference value range SB, the monitoring circuit 48 jumps into the reporting mode ME, in which a defect in the detector line system 24 is reported via a defect signal D.

With this procedure, the most varied of defects of the detector line system 24 can be detected.

A first possible defect would be the interruption of the supply line system 12 at an optional point between the current feed-in connection 14 and the load connection 16.

Such an interruption automatically leads to the interruption of the detector line system 24, as well, on account of the association of the detector line system 24 with the supply line system 12.

Such an interruption leads to the potential at the central tap 44 being adjusted to the potential of the voltage supply 42 and, therefore, the test signal P itself having a potential which is outside the reference value range SB when this is defined such that it allows, for example, a deviation from the measured test signal P of around +/−10%.

An additional defect would be a short circuit between the detector line system 24 and ground M. This occurs, for example, due to the fact that the supply line system 12 is damaged mechanically due to friction or other mechanical influences to such an extent that a connection can result between the detector line system 24 and a part leading to ground, for example, a part of the bodywork. On account of this short circuit, the influence of the end element 32 is cancelled and so the test signal P likewise assumes values which are outside the reference value range SB.

A short circuit of this type can occur not only in relation to the ground M but also, for example, in relation to a part which is at the potential of the voltage supply 42. In this case, as well, the test signal is seriously altered in such a manner that it is outside the reference value range SB.

An additional defect would be the formation of an electric arc, either on account of two oppositely located parts of the line harness 20, on account of an interruption of only the line harness 20 or due to damage to the protective casing 22 in such a manner that an electric arc is formed between the line harness 20 and, for example, ground or another potential.

In this respect, if the detector line system 24 is designed such that it alters its electrical behavior irreversibly when a local electric arc occurs, in particular, causes an interruption of the electrical conductivity during the course of time, such an electric arc leads to the electrical resistance of the detector line system 24 also being seriously altered in such a manner that the test signal P is outside the reference value range SB.

As a result, a large number of defects may be recognized by means of the solution according to the invention via their influence on the test signal P.

The solution according to the invention is, however, not limited to the monitoring of direct voltage potentials as test signals P.

For example, it is conceivable not to apply a direct voltage but rather a high frequency signal to the voltage supply 42 so that this likewise results in a high frequency test signal P at the central tap 44 of the voltage divider via the two branches 50 and 52 of the voltage divider.

In this respect, the electrical resistors 34 and 38 can also be inductive or capacitive resistors or also comprise ohmic inductive and/or capacitive parts.

In this case, the monitoring circuit 48 does not detect any direct voltage potential but rather at least the amplitude, where applicable also the frequency of the test signal P. The amplitude is influenced in this respect by the same defects as those explained in conjunction with direct voltage potentials.

In addition, it is also possible to detect, in particular, the formation of electric arcs via the couplings in of frequency parts which have a high frequency but do not, however, correspond to the frequency on the voltage supply line 42 and which are coupled into the detector line system 24 as a result of the occurrence of the electric arcs.

If a defect of this type is recognized by the monitoring circuit 48 and the defect signal D issued, this can, in the simplest case, be used directly in a disconnection circuit 54 for the purpose of disconnecting the connection between the current feed-in connection 14 and the current source Q and, therefore, of avoiding any risk which could occur due to current being supplied to the supply line system 12.

In a second embodiment of an electrical supply network according to the invention with a network system 10, those elements which are identical to those of the first embodiment are given the same reference numerals and so, with respect to the description thereof, reference can be made in full to the comments concerning the first embodiment.

In contrast to the first embodiment, the end element 32 of the second embodiment is, however, not connected directly to the ground M but rather to a ground line 56 of the load device V leading to the ground so that when the mass connection to the load device V is lost, for example, due to an interruption between the ground line 56 and the ground M, this is likewise recognizable as a defect by the monitoring circuit 48, in addition to all the other defects already described, and likewise leads to a triggering of the disconnection circuit 54.

Figure 4:
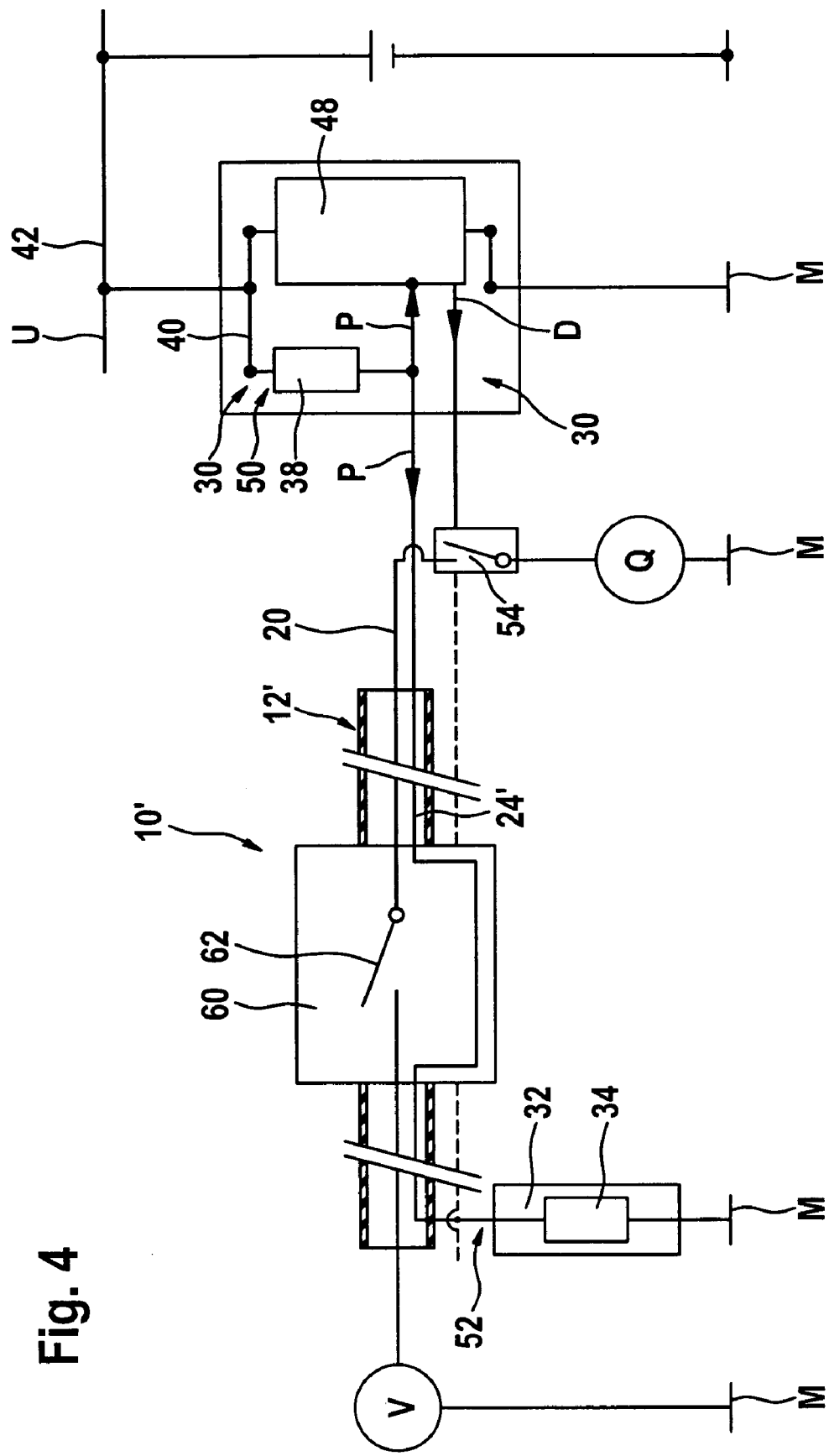
FIG. 4 shows a circuit diagram of a third embodiment.

In a third embodiment, illustrated in FIG. 4, of an electrical supply network according to the invention with a network system 10', a control device, which is designated as a whole as 60 and comprises, for its part, for example, a switch 62 for interrupting the line harness 20, is integrated in the supply line system 12'.

In this embodiment, the detector line system 24' is looped through the control device 60 so that, in the same way as in the first embodiment, an overall monitoring of the supply line system 12' together with the control device 60 is possible since, as a result, it is also possible on account of the detector line system 24 looped through the control device 60 not only to monitor the defects described in conjunction with the first embodiment but also defects with respect to the connection between the supply line system 12 and the control device 60 since defects of this type likewise lead to interruptions in the area of the detect line system 24 looped through the control device 60.

Figure 5:
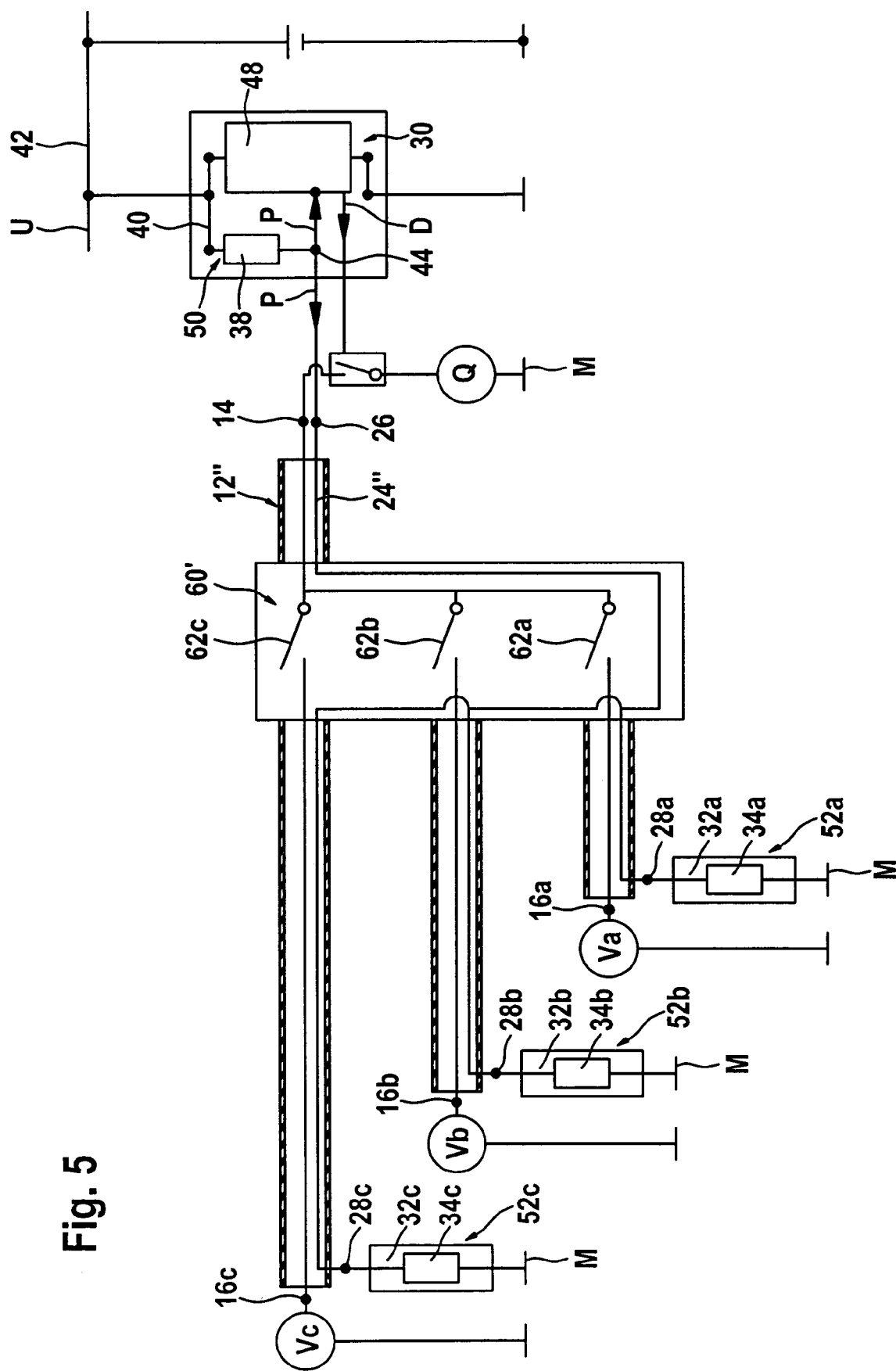
FIG. 5 shows a circuit diagram of a fourth embodiment.

A fourth embodiment, illustrated in FIG. 5, provides not only for a control device 60 with a switch but rather a control device 60 with altogether three switches 62a, 62b, 62c, with which it is possible to switch altogether three load devices Va, Vb, Vc on or off.

In this respect, the supply line system 12" is constructed such that it experiences a branching when looping through the control device 60' proceeding from the current feed-in connection 14 and, as a result, leads to altogether three load connections 16a, 16b and 16c.

In the same way as the supply line system 12", the detector line system 24" also experiences a branching in such a manner that it now has not only one additional end 28 but rather altogether three additional ends 28a, 28b, 28c, each of which is connected to the ground M via its own end element 32a, 32b and 32c.

In this case, the voltage divider for generating the test signal P is formed, on the one hand, by the first branch 50 and, on the other hand, by altogether three second branches 52a, 52b and 52c which are all connected in parallel between the central tap 44 and the ground M.

If, in this fourth embodiment, a defect now occurs, for example, in the supply line system 12" in the area between the control device 60' and one of the load connections 16a, 16b, 16c, this likewise leads to a change in the test signal P but to a smaller extent than in the case of the embodiments described above since altogether three additional branches 52a, 52b and 52c are connected in parallel and, therefore, only one of the additional branches 52a, 52b, 52c of the voltage divider fails.

In this case, the reference value range SB is to be set accordingly narrower and, on the other hand, the electrical resistances 34a, 34b, 34c are to be increased where applicable.

Figure 6:
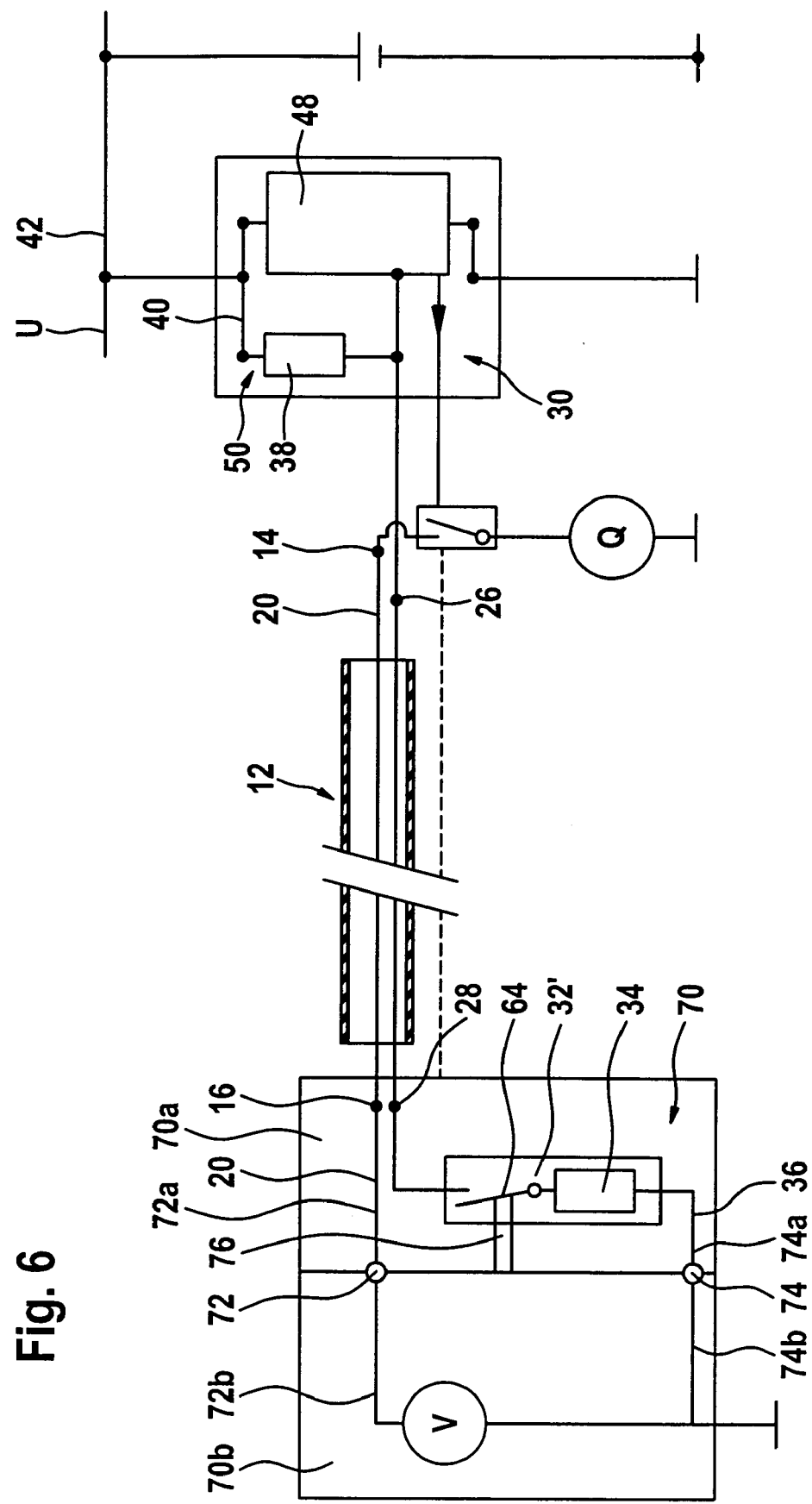
FIG. 6 shows a circuit diagram of a fifth embodiment.

A fifth embodiment of an electrical supply network according to the invention, illustrated in FIG. 6, is based on the second embodiment, wherein the end element 32' comprises in addition to the electrical resistor 34 an additional switch 64 which offers the possibility of recognizing additional defective states.

In addition, the line harness 20 is connected to the load device V via a plug connector 70, comprising a plug connector element 70a on the side of the supply line system and a plug connector element 70b on the side of the load device. The plug connector has a releasable contact 72 with contact elements 72a and 72b for the line harness 20 and a releasable contact 74 with contact elements 74a and 74b for the connection line 36.

If, for example, the end element 32' is integrated in the releasable plug connector element 70a on the side of the supply line system, it is possible to actuate the switch 64 via a mechanical plunger 76 which facilitates, for example, a sampling for the reliable seating of the plug connector elements 70a, 70b and so the plunger 76 closes the switch 64 when the releasable plug connector element 70a is used as directed. If, however, no orderly connection takes place by way of the releasable plug connector element 70a, the plunger 76 does not close the switch 64 and the second branch 52 of the voltage divider is interrupted and so the test signal P is no longer in the reference value range SB.

Figure 7:
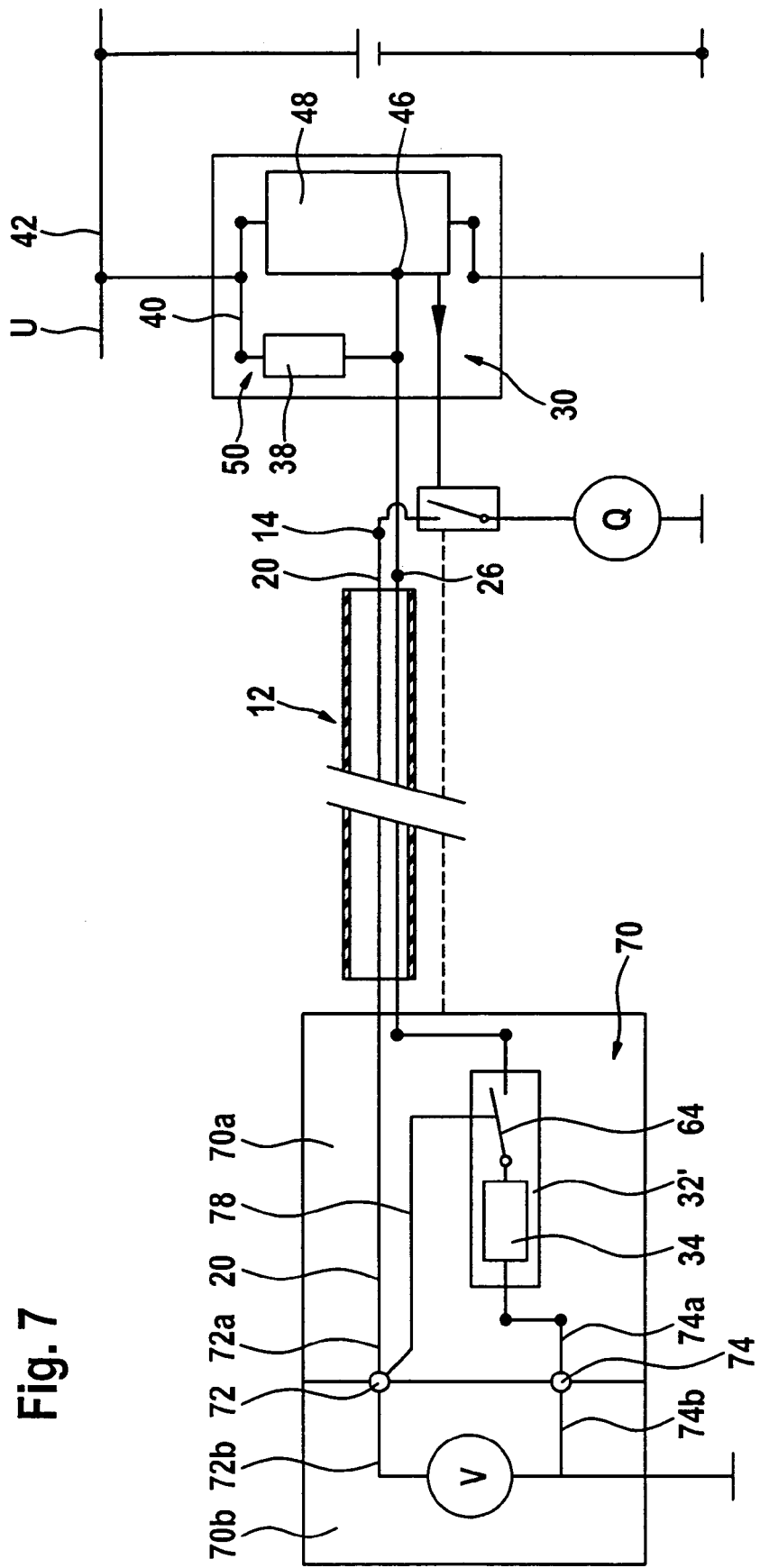
FIG. 7 shows a circuit diagram of a sixth embodiment.

The releasable plug connector element 70a on the side of the supply line system, in which an end element 32' with a switch 64 is integrated, is also provided in a sixth embodiment, illustrated in FIG. 7. The switch 64 is, in this case, however, not actuatable mechanically by the plunger 76 but rather is actuatable electrically, for example, via a control line 78 which leads to the line harness 20 and, therefore, checks whether the voltage generated by the current source Q is actually applied to the releasable plug contact 72 or not. As a result, it can be checked directly with this embodiment whether the line harness 20 is electrically conductive to its full extent and every interruption in the line harness 20, even without any damage to the protective casing 22, would lead to the switch 64 opening and, therefore, to the defect signal D being generated on the part of the monitoring circuit 48.

Figure 8:
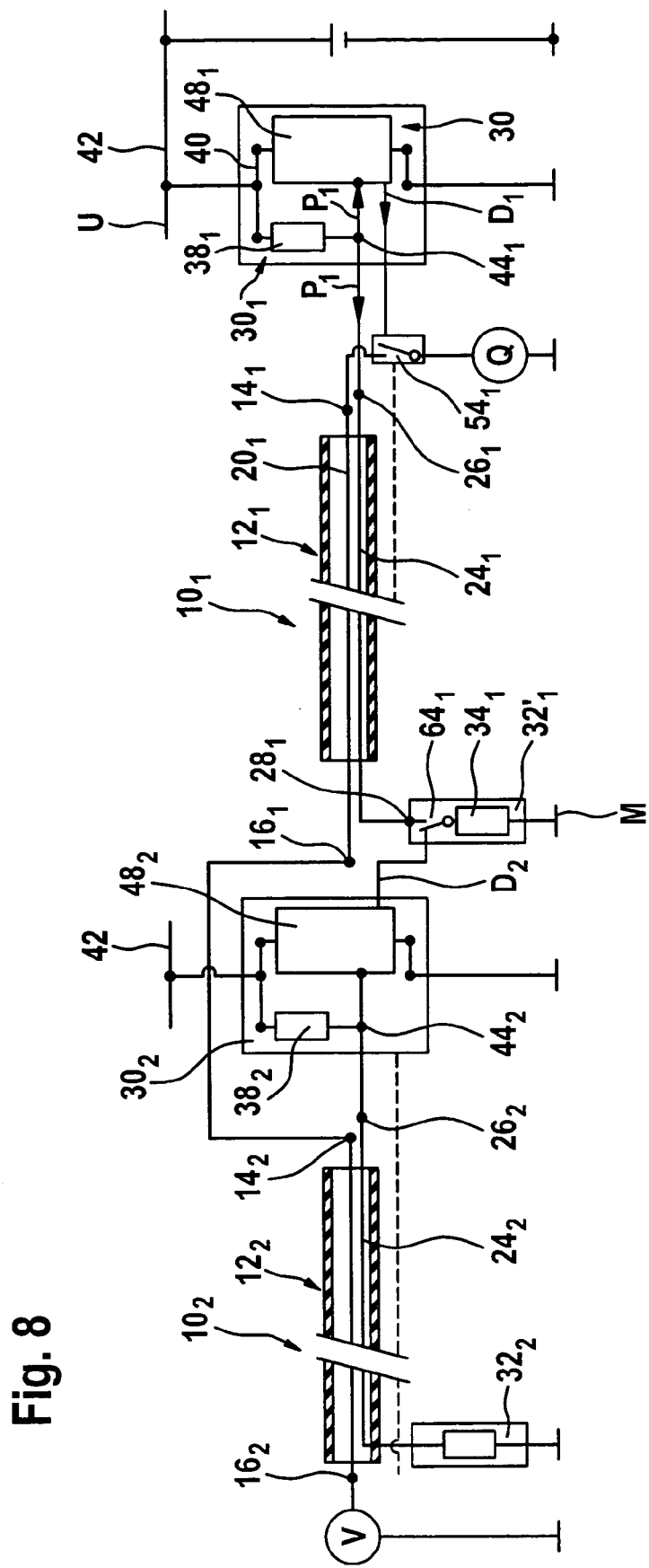
FIG. 8 shows a circuit diagram of a seventh embodiment.

A seventh embodiment of an electrical supply network according to the invention, illustrated in FIG. 8, comprises two network systems 10$_1$ and 10$_2$ arranged one behind the other, wherein the first network system 10$_1$ comprises an end element 32'$_1$ with a switch 64$_1$.

The monitoring functions of the first network system correspond, for example, to the monitoring functions described in conjunction with the sixth or seventh embodiments.

However, the load device V is not connected directly to the load connection 16$_1$ in the case of the first network system 10$_1$ but rather a second network system 10$_2$ with a current feed-in connection 14 is connected in between and so the load device V is connected to its load connection 16$_2$.

The second network system 10$_2$ comprises, for its part, its own detector circuit 30$_2$, by means of the defect signal D$_2$ of which the switch 64$_1$ can be activated.

This means that the detector circuit 30$_2$ monitors the network system 10$_2$ with respect to possible defects in the same way as that already described in conjunction with the preceding embodiments but its defect signal D$_2$ has a feedback effect on the first network system 10$_1$ in that an actuation of the switch 64$_1$ in the end element 32'$_1$ is brought about and, therefore, triggers the defect signal D$_1$ in the first network system 10$_1$ which, for its part, again activates the disconnection circuit 54$_1$ and, therefore, disconnects the current source Q from the current feed-in connection 14$_1$ of the first network system.

Figure 9:
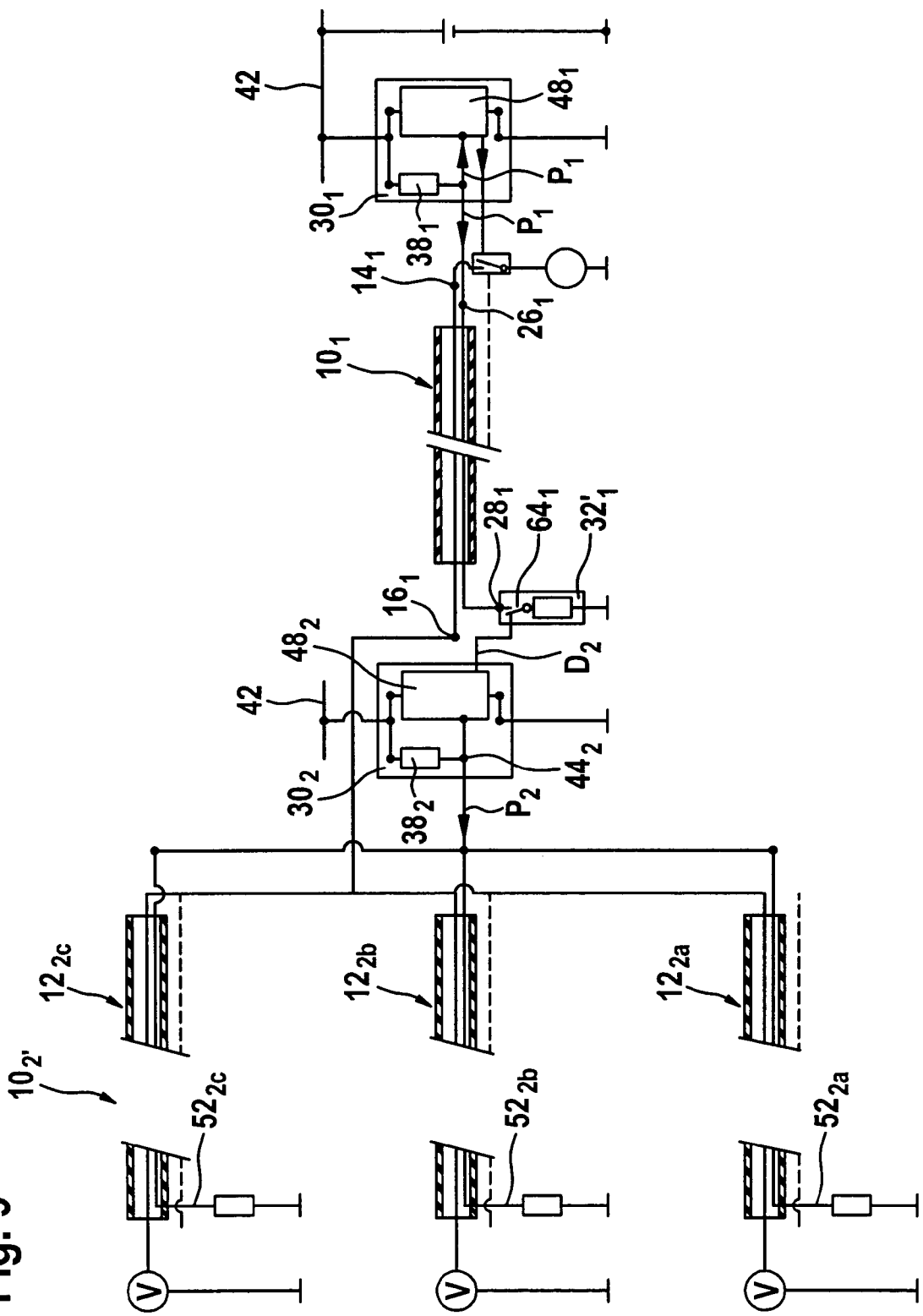
FIG. 9 shows a circuit diagram of an eighth embodiment.

An eighth embodiment of an electrical supply network according to the invention, illustrated in FIG. 9, is based on the seventh embodiment, illustrated in FIG. 8, with the difference that the second network system 10$_{2'}$ has three supply line systems 12$_{2a}$, 12$_{2b}$ and 12$_{2c}$ which are connected in parallel and are all fed in parallel from the load connection 16$_1$ of the first network system 10$_1$ and are, at the same time, also monitored in parallel by a detector circuit 30$_2$ so that altogether three second branches 52$_{2a}$, 52$_{2b}$ and 52$_{2c}$ are connected in parallel to the central tap 44$_2$ and all three second branches 52$_{2a}$, 52$_{2b}$ and 52$_{2c}$ influence the test signal P$_2$ at the same time.

As a result, the monitoring of the second network system 10$_{2'}$ works in a similar way to that of the fourth embodiment of a supply network according to the invention illustrated in FIG. 5.

Furthermore, the defect signal D$_2$, which is generated by the detector circuit 30$_2$ of the second network system 10$_{2'}$, acts on the switch 64$_1$ of the end element 32'$_1$, of the first network system 10$_1$ so that all the defect states of the first network system 10$_1$ as well as defect states of the second network system 10$_{2'}$ can be detected by the detector circuit 30$_1$ in the first network system 10$_1$.

Figure 10:
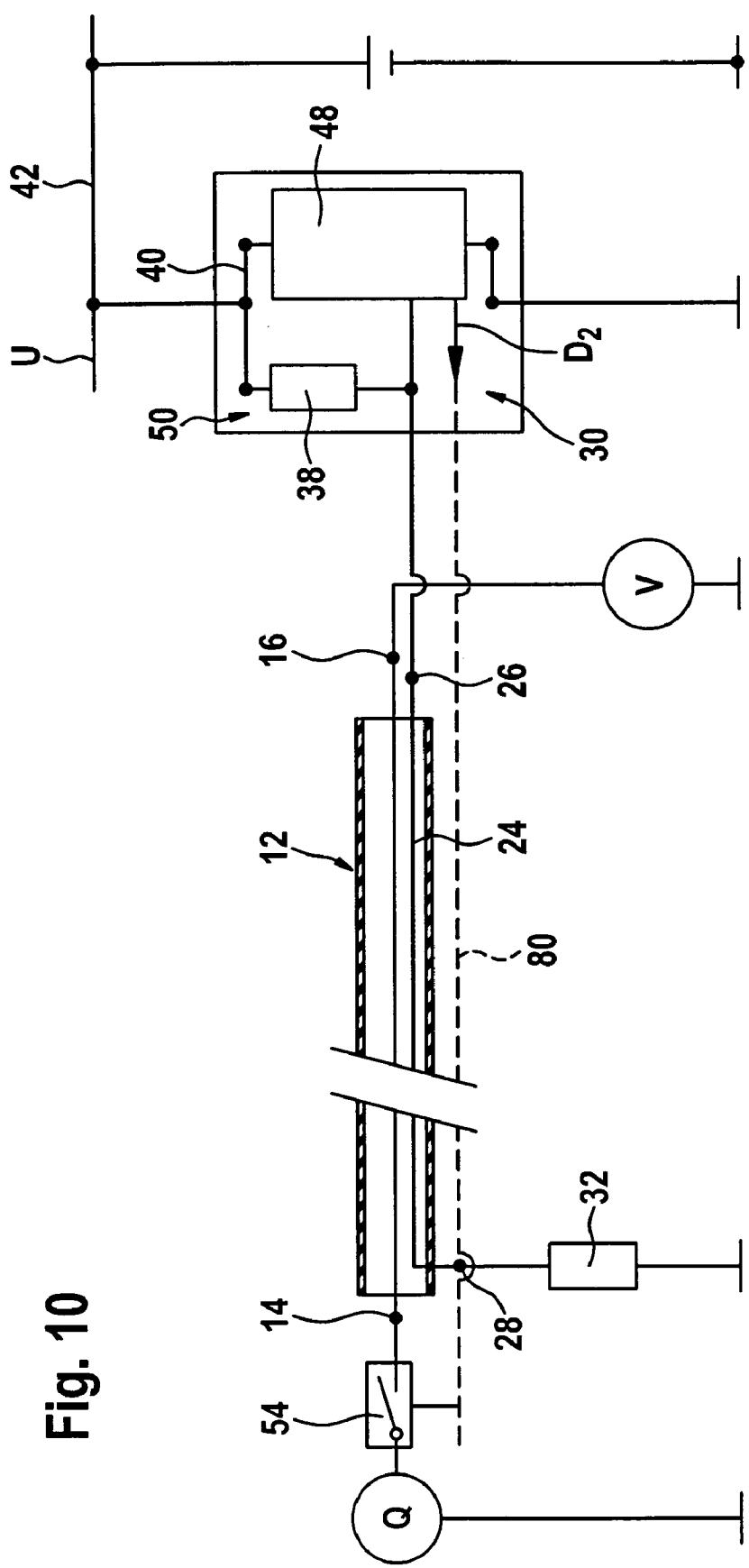
FIG. 10 shows a circuit diagram of a ninth embodiment.

A ninth embodiment of an electrical supply network according to the invention, illustrated in FIG. 10, is based, in principle, on the first embodiment, with the difference that the current feed-in connection 14 of the supply line system 12 and the additional end 28 of the detector line system 24 are associated with one another at the same end of the supply line system 12 while the load connection 16 and the first end 26 of the detector line system 24 are likewise associated with one another at the same end of the supply line system 12.

This means that the detector circuit 30 is arranged at the end of the supply line system 12 which is remote from the current feed-in connection 14. A disconnection circuit 54 arranged between the current source Q and the current feed-in connection 14 is, therefore, to be activated either via a control line 80 guided in addition along the supply line system 12 or via a bus system.

As for the rest, the ninth embodiment functions in the same way as that described in conjunction with the first embodiment.

Figure 11:
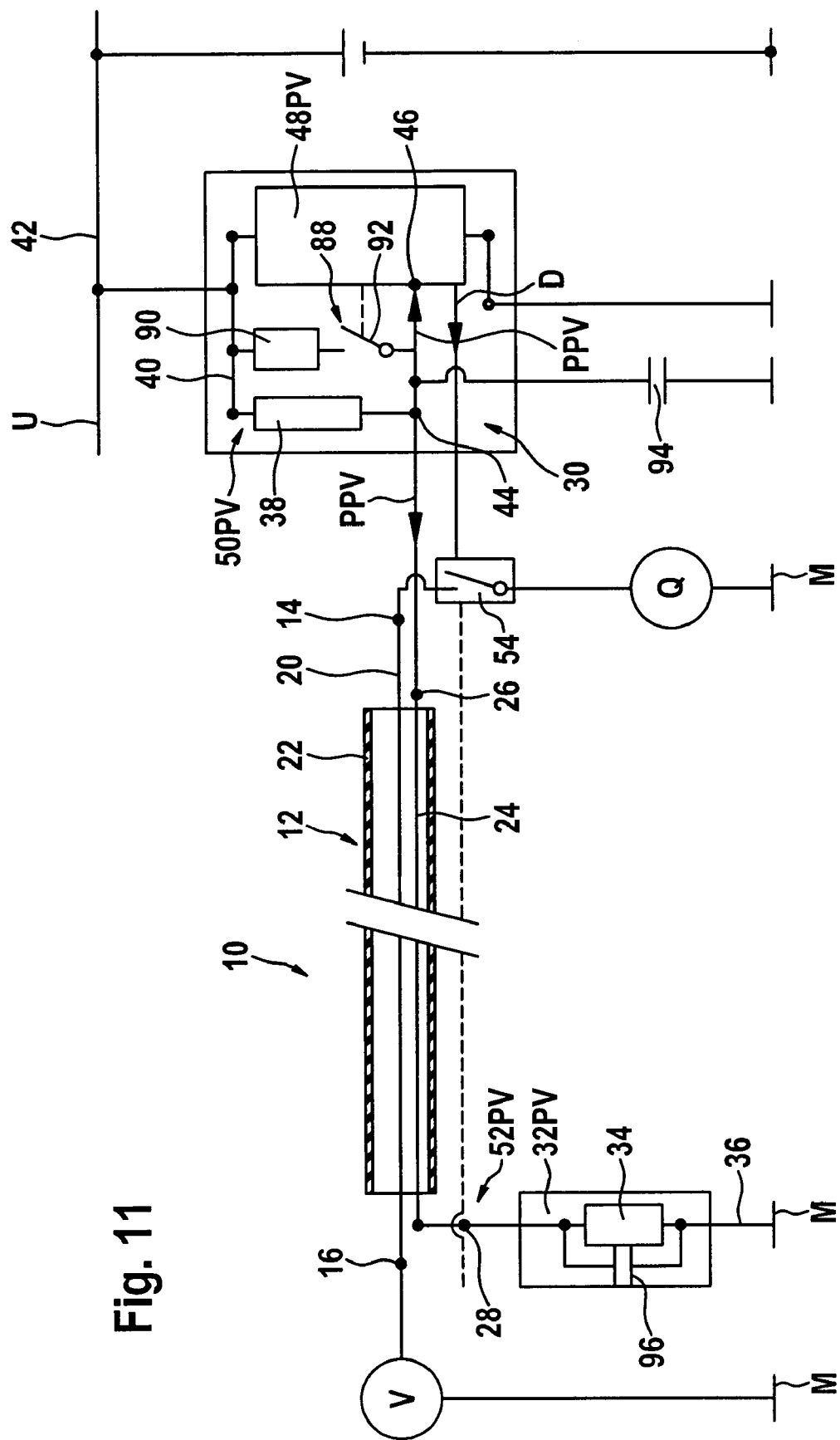
FIG. 11 shows a circuit diagram of a tenth embodiment.

In a tenth embodiment of a supply network according to the invention, illustrated in FIG. 11, a parallel path 88 is connected in parallel to the electrical resistor 38 and this has a resistor 90 and a switch 92.

The switch 92 can preferably be activated by the monitoring circuit 48V.

As a result, the first branch 50PV of the voltage divider is formed not only by the connection line 40 and the resistor 38 but by the electrical resistor 90 connected in parallel when the switch 92 is closed and, in the case of an opened switch, merely by the connection line 40 and the resistor 38.

Figure 12:
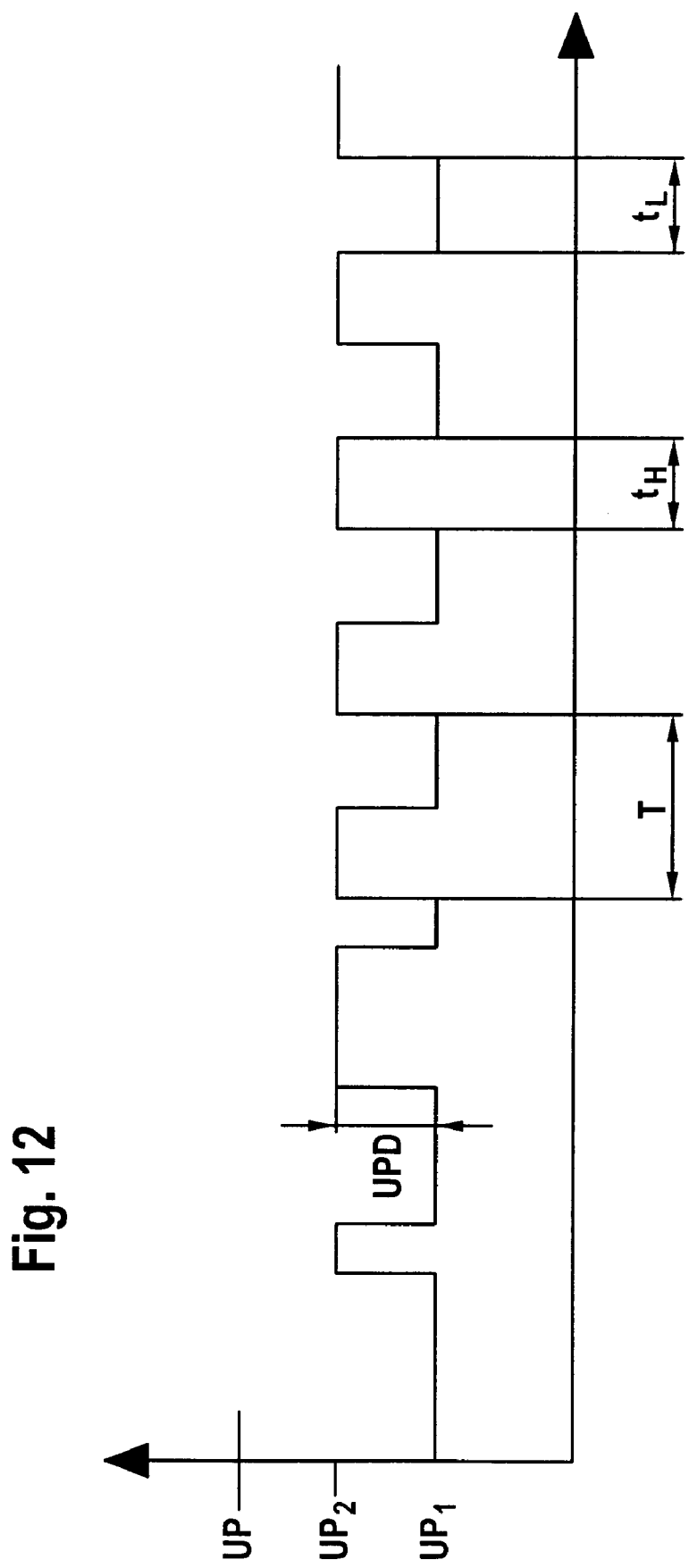
FIG. 12 shows an illustration of a curve of a test signal in the case of several direct voltage potentials.

As a result, it is possible, depending on whether the switch 92 is closed or opened, to vary the potential UP forming the test signal PPV, as illustrated in FIG. 12, between the value $UP_1$ which results when switch 92 is open and, therefore, with only the operative, electrical resistor 38 and the value $UP_2$ which results when switch 92 is closed and, therefore, with the electrical resistor 90 connected in parallel to the electrical resistor 38, as illustrated in FIG. 12.

In this respect, the monitoring circuit 48PV need not alter the potential between $UP_1$ and $UP_2$ in accordance with a periodic function but rather it can also carry out optionally stochastic variations or also leave the test signal at one of the potentials $UP_1$ or $UP_2$ and change back and forth briefly between $UP_1$ and $UP_2$ or vice versa by actuating the switch 92 only when a monitoring cycle is intended to be carried out.

The monitoring circuit 48 can, in this embodiment, use the test signal PPV with one of the potentials $UP_1$ and $UP_2$ for measurement or it can, in the simplest case, determine the difference between the potentials $UP_1$ and $UP_2$.

Since, during the determination of the difference between the potentials $UP_1$ and $UP_2$ the second branch 52 of the voltage divider is the same and also variations in the ground potential, which can easily occur in the case of a vehicle, the bodywork of which is connected to ground M, have an effect on the second branch 52 in the same way both during the measurement of the potential $UP_1$ or the measurement of the potential $UP_2$, such a determination of the difference between the potentials $UP_1$ and $UP_2$ is independent of any so-called "ground shift" in a vehicle bodywork.

The evaluation is carried out in this case analogously to the first embodiment, using the difference signal UPD which is then compared with the reference value range SB instead of the test signal PPV.

The reference value range SB can, as likewise described in the first embodiment, be determined in the steps L1 and L2 of the learning mode, wherein the value UPD is likewise used for determining the reference value range SB instead of the immediate test signal PPV.

Alternatively or in addition to determining the difference UPD, it is also possible in the tenth embodiment to evaluate the period interval T of consecutive pulses when the switch 92 is switched cyclically with a specific frequency.

It is, however, also possible to evaluate the times of the high phase $t_H$ or the times of the low phase $t_L$ by means of the monitoring circuit in the case of a set, predetermined period course.

Figure 13:
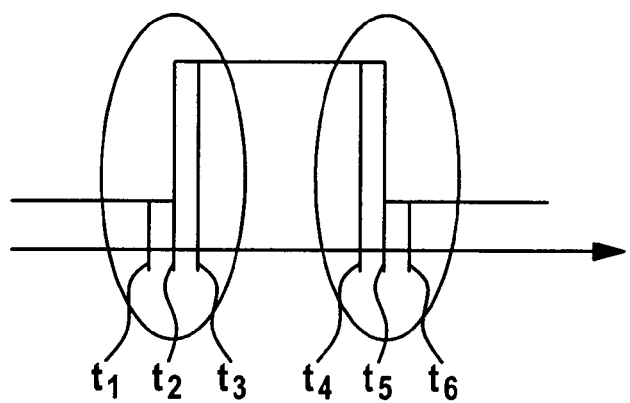
FIG. 13 shows an illustration of an evaluation in a flank area in the case of a test signal according to FIG. 12.

Finally, it is also possible, as illustrated in FIG. 13, to evaluate the rising flank and the descending flank by sampling the entire course of the potential UP of the test signal PPV, for example, in periods of time between the points of time $t_1$ to $t_6$, as illustrated in FIG. 13, in particular, at the points of time $t_1$ and $t_3$ as well as $t_4$ and $t_6$.

Figure 14:
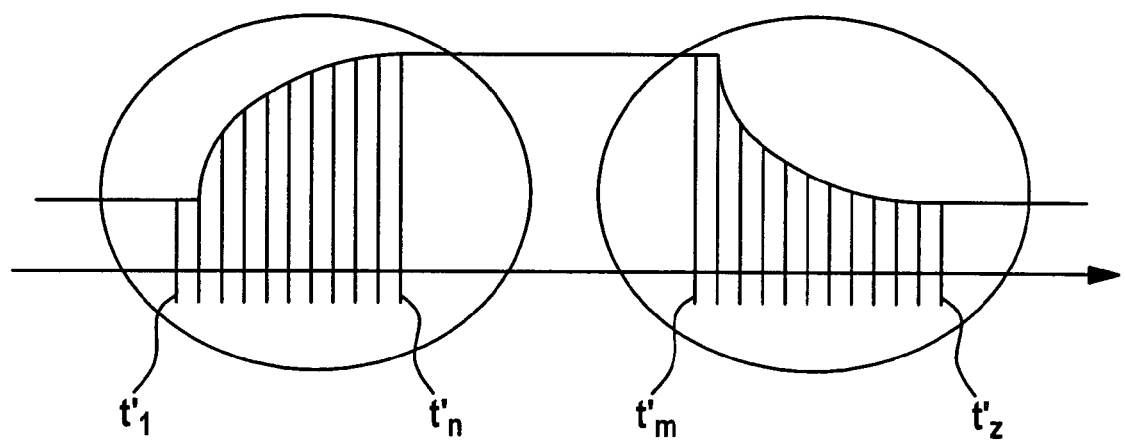
FIG. 14 shows an alternative illustration of an evaluation of a flank area in the case of a test signal according to FIG. 12.

When, in the tenth embodiment, as illustrated in FIG. 11, a capacitor 94 is also provided between the central tap 44 of the voltage divider formed by the branches 50 and 52 and ground M and, in addition, the end element 32PV also comprises a capacitor 96 connected in parallel to the resistor 34, the rising flank and descending flank of the entire course of the potential UP of the test signal PPV will have, as illustrated in FIG. 14, rising and falling flanks which are retarding with respect to time and may likewise be determined by way of sampling during the points of time $t'_1$ to $t'_n$ and $t'_n$ and $t'_m$ to $t'_z$.

Such sampling, as described in FIGS. 13 and 14, is brought about in the simplest case in such a manner that the monitoring circuit 48PV detects and memorizes the potential UP of the test signal PPV at the individual points of time t by way of an AD converter and then detects and memorizes it again at the next point of time t.

The tenth embodiment operates in the defect-free state of the detector line system 24 such that in specific periods of time the potential UP of the test signal P is switched back and forth between the values $UP_1$ and $UP_2$ due to actuation of the switch 92 on the part of the monitoring circuit 48.

If the system is working perfectly, the difference UPD is in the reference value range SB when the difference UPD between the potentials $UP_1$ and $UP_2$ of the test signal P is determined.

If, for example, the detector line system 24 is interrupted in such a manner that a connection no longer exists to one of the end elements 32PV, in particular, to the end element 32PV, a test signal is no longer present and the difference UPD likewise no longer exists.

If a connection of the detector line system 24 takes place with an optional potential, i.e., with the ground M or another potential, for example, a lower voltage in the motor vehicle, this has an effect on the potential UP of the test signal PPV and a comparison of the potential UP with a reference value SB provided for it makes it possible to recognize this and trigger a defect signal D by means of the monitoring circuit 48PV.

Such a connection with an optional potential, i.e., ground or another voltage also has an effect, however, on the flank during the transition from the potential $UP_1$ to the potential $UP_2$ or vice versa and so an evaluation by way of sampling of the flanks during the points in time $t_1$ to $t_6$ according to FIG. 13 or during the points in time $t'_1$ to $t'_n$ and $t'_m$ to $t'_z$ according to FIG. 14 can provide information on this.

Figure 15:
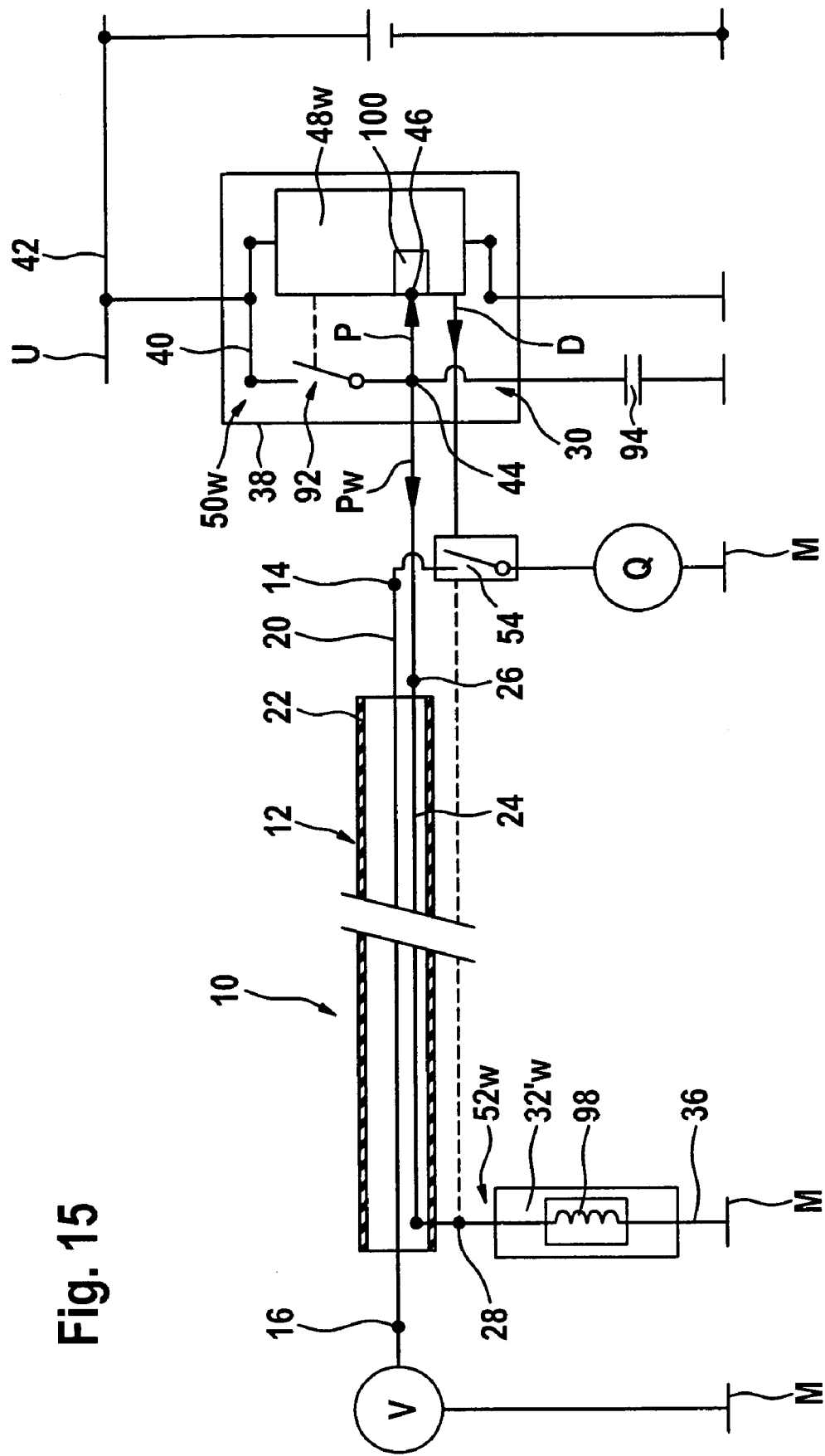
FIG. 15 shows a circuit diagram of an eleventh embodiment.

In an eleventh embodiment, illustrated in FIG. 15, the first branch 50W merely comprises the switch 92 and the end element 32W comprises an inductor 98 alternatively or in addition to the resistor 34.

Furthermore, the capacitor 94 is likewise still present, in addition, between the central tap 44 and ground M.

As a result, the detector line system 24 is part of an oscillating circuit which can be excited either by way of a clocked switching of the switch 92 with rectangular pulses or by way of operation of the oscillating circuit with an alternating voltage U, wherein, in this case, the switch 92 offers the possibility of exciting the oscillating circuit when the switch 92 is closed and of allowing it to oscillate freely when the switch 92 is opened.

The monitoring circuit 48W then monitors the resulting resonance frequency via band filters 100. Every change in the properties of the detector line system 24 and, in particular, any decoupling of individual end elements 32 or a connection of the detector line system 24 with an optional potential then leads to the resonance frequency being altered and this may be determined via the band filters 100 by way of the frequency analysis.

Figure 16:
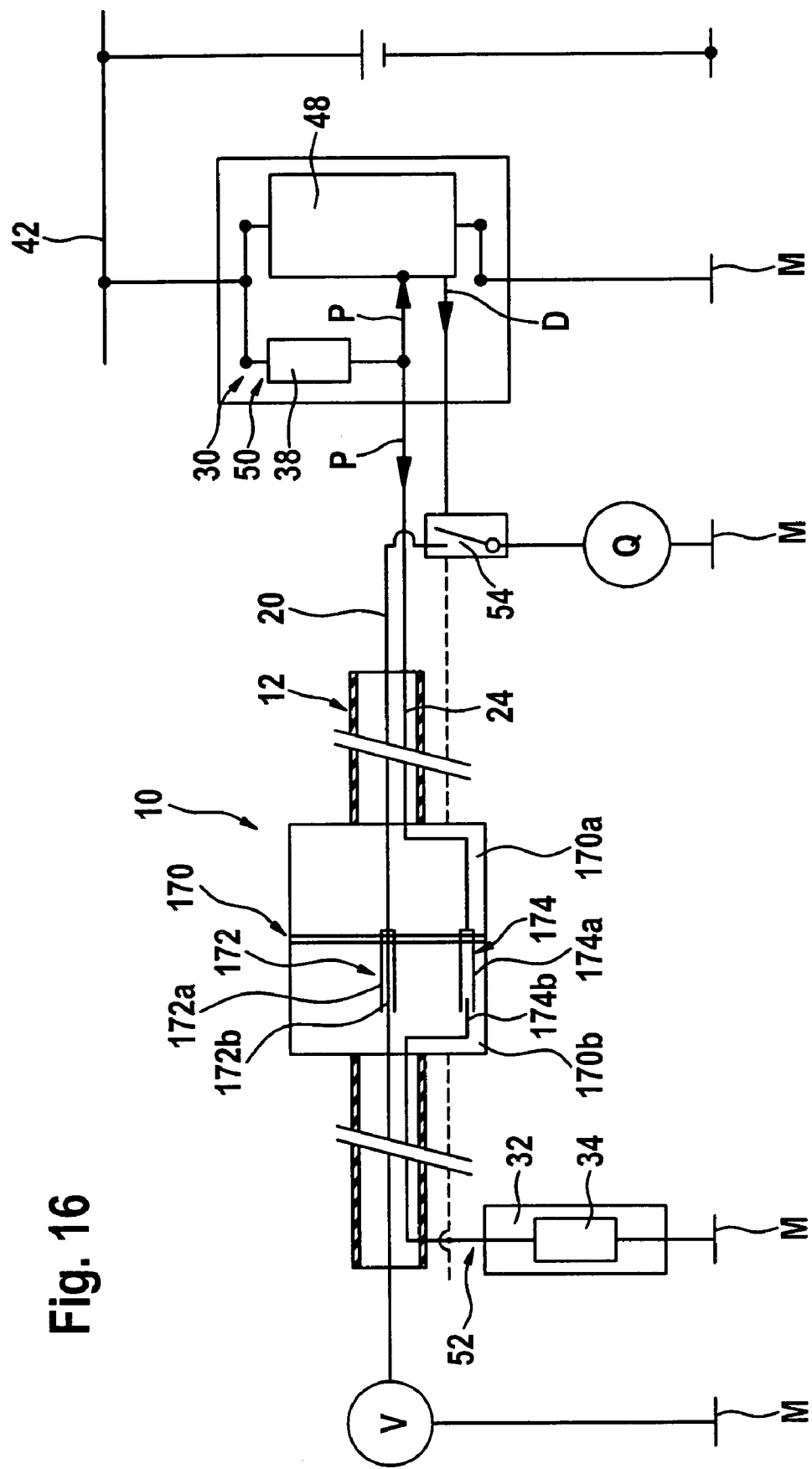
FIG. 16 shows a circuit diagram of a twelfth embodiment.

A twelfth embodiment, illustrated in FIG. 16, is based on the first embodiment but a plug connection 170 with two plug connector elements 170*a* and 170*b* which can be released from one another is provided in the supply line system 12.

The plug connector element 170*a* bears contact elements 172*a* and 174*a* which can be brought into plug connection with corresponding contact elements in the plug connector element 170*b*, namely with the contact elements 172*b* and 174*b*.

In this respect, the contact elements 172*a* and 172*b* of the plug contact 172 arranged in the current-carrying line harness are preferably designed in such a manner and arranged on the plug connector elements 170*a* and 170*b* such that during the plugging together they come into contact prior to the contact elements 174*a* and 174*b* of the plug contact 174 arranged in the detector line harness 24 and during the release of the plug connector elements 170*a* and 170*b* the electrical connection is disconnected first of all at the contact elements 174*a* and 174*b* before the electrical connection between the contact elements 172*a* and 172*b* is disconnected.

Since the contact elements 174*a* and 174*b* are arranged in the detector line system 24, this leads to the contact elements 172*a* and 172*b* coming into contact first of all when the plug connector elements 170*a* and 170*b* are plugged together and, therefore, an electrical connection being generated in the line harness 20 before, in the detector line system 24, the second branch 52 of the voltage divider is completed and, therefore, functional due to the electrical connection between the contact elements 174*a* and 174*b* being provided.

On the other hand, during the release of the plug connector elements 170*a* and 170*b*, the detector line system 24 is interrupted on account of the preceding release of the contact elements 174*a* and 174*b* before an electrical interruption takes place due to disconnection of the contact elements 172*a* and 172*b* in the line harness 20.

As a result of such a design of the plug connector 170, the reliable connection of the plug connector elements 170*a* and 170*b* is likewise automatically monitored by the monitoring circuit 48 since any unintentional disconnection of the plug connector elements 170*a* and 170*b* on account of the premature release of the contact elements 174*a* and 174*b* in relation to the release of the contact elements 172*a* and 172*b* prior to any electrical disconnection in the line harness 20 leads to a defect signal D and so the supply to the line harness 20 is interrupted by the disconnection circuit 54. As a result, the contact elements 172*a* and 172*b* are prevented from being disconnected from one another during the flow of current to the load device V and, as a result, an electric arc is prevented from being formed on account of the high voltage.

In the same way, the monitoring circuit transmits the defect signal D when the plug connector elements 170*a* and 170*b* are disconnected for such a time until a reliable connection exists between the contact elements 172*a* and 172*b* since the contact elements 174*a* and 174*b* come into electrical contact with one another only with a delay in time and always allow the defect signal D to be dropped by completing the detector line system 24 only when a reliable electrical connection has already existed for some time between the contact elements 172*a* and 172*b* in the line harness 20 and so no electric arc can result during the plugging together of the contact elements 172*a* and 172*b*.

Figure 17:
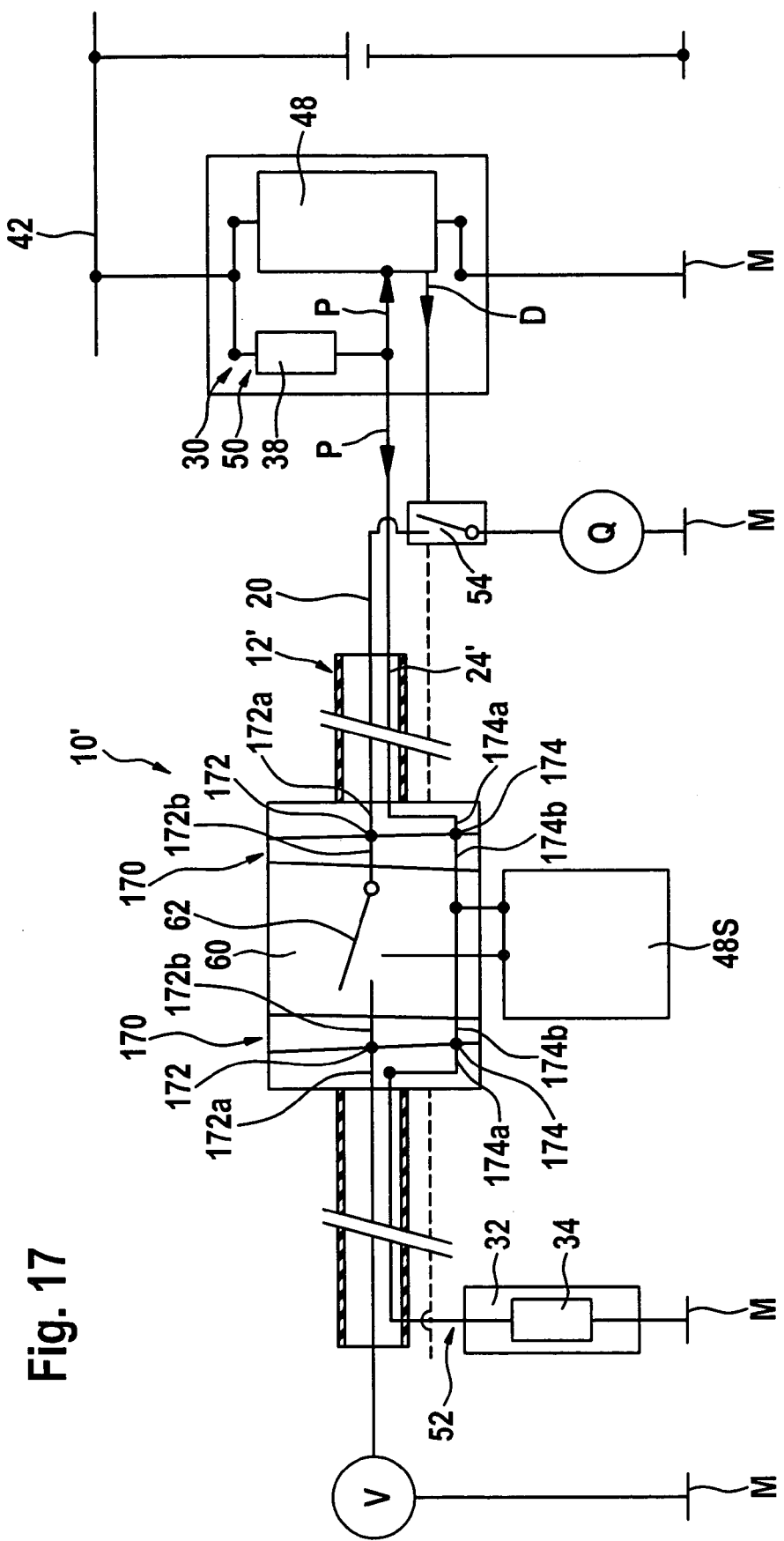
FIG. 17 shows a circuit diagram of a thirteenth embodiment.

A thirteenth embodiment illustrated in FIG. 17 is based on the third embodiment according to FIG. 4 and so reference is made in full to the explanations concerning the third embodiment with respect to the description of the parts not mentioned in detail.

The control device 60 is, in the thirteenth embodiment, not integrated into the supply line system 12' directly but is rather integrated into the supply line system 12' via plug connectors 170 described in conjunction with the twelfth embodiment.

The plug connectors 170 each have a plug contact 172 with contact elements 172*a* and 172*b* as well as a plug contact 174 with contact elements 174*a* and 174*b* which are designed in the same way as that described in conjunction with the twelfth embodiment.

Furthermore, the control device 60 has its own monitoring circuit 48S allocated to it and this monitors the presence of the test signals P in the detector line system 24' independently of the monitoring circuit 48 and activates the switch 62 when a correct test signal is not present in such a manner that this opens.

As a result, it may be ensured by the monitoring circuit 48S of the control device 60, independently of the monitoring circuit 48, that the line harness 20 leading to the load device V is interrupted by the switch 62 as soon as one of the plug connectors 170 is released at the control device 60.

It is, therefore, ensured that in the case of both plug connectors 170 of the control device 60 any release of the contact elements 172*a* and 172*b* always takes place in a state, in which no current flows to the load device V through the line harness 20, and so it may be precluded that any electric arc will be formed when the contact elements 172*a* and 172*b* are disconnected.

Figure 18:
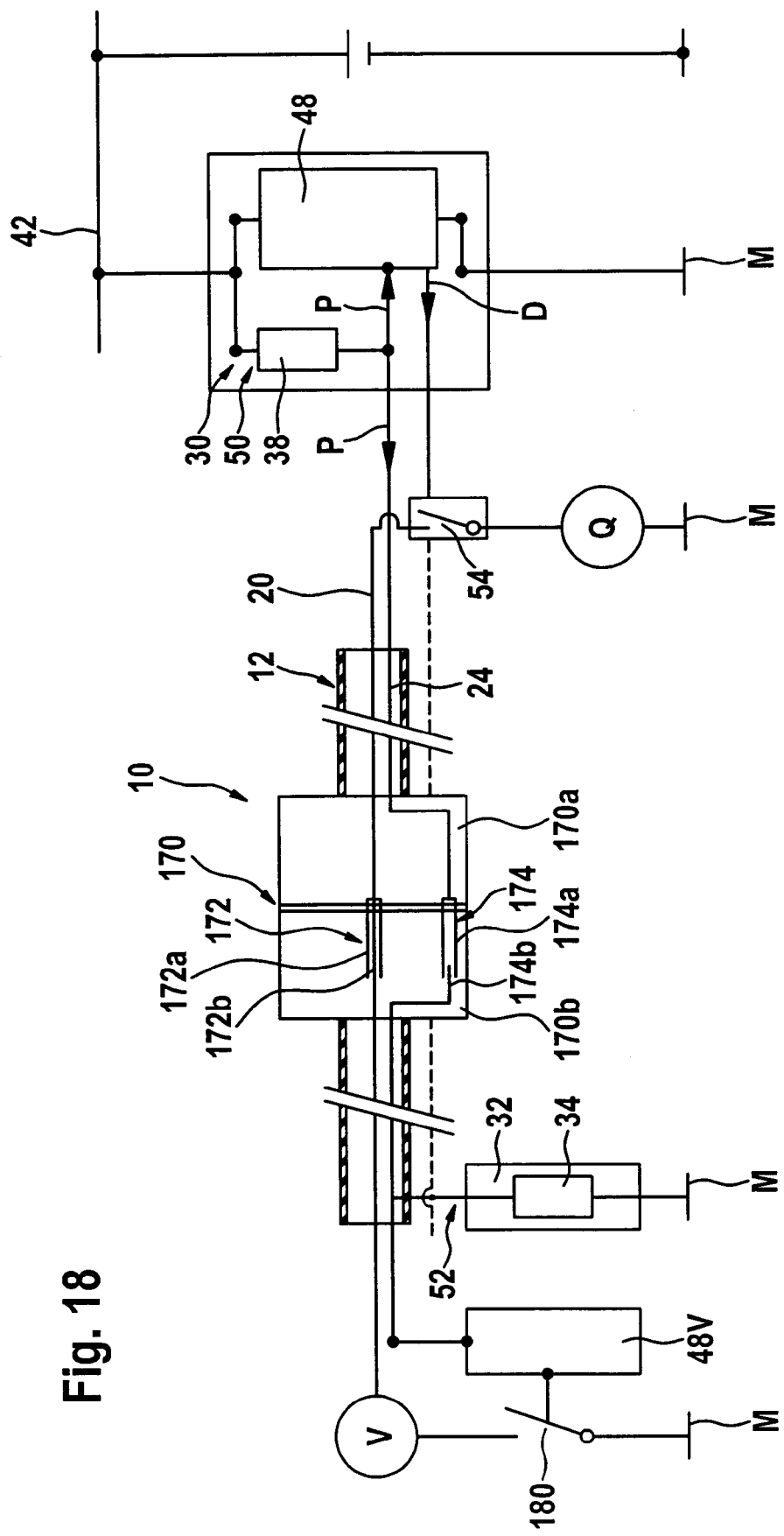
FIG. 18 shows a circuit diagram of a fourteenth embodiment.

A fourteenth embodiment, illustrated in FIG. 18, is based on the twelfth embodiment, illustrated in FIG. 16.

In the fourteenth embodiment, the load device V has its own monitoring circuit 48V allocated to it and this monitors whether the test signal P is present in the correct manner on the side of the load device V.

If this test signal P is not present, for example, because the plug connector 170, which is designed in the same way as in the twelfth embodiment, is disconnected, the monitoring circuit 48V actuates, for example, a ground switch 180 which disconnects the load device V from the ground, namely before the contact elements 172*a* and 172*b* interrupt the line harness 20 and so the interruption of the line harness 20 can be brought about by the contact elements 172*a* and 172*b* without any formation of an electric arc.

The monitoring circuit 48V operates, for example, independently of the monitoring circuit 48 so that, where applicable, the monitoring circuit 48 and the disconnection circuit 54 can also be omitted when only the correct electrical connection at the plug connector 170 is intended to be monitored but with the disadvantage that the full voltage of the source Q is still applied to the line harness leading to the contact element 172 and to the contact element 172 when the plug connector 170 is disconnected.

In the twelfth, thirteenth and fourteenth embodiments, the monitoring of the plug connector 170 is integrated into the detector line system 24 and, therefore, the advantages existing in the preceding embodiments as a result of the detector line system 24 and the detector circuit 30 are also present in addition to the monitoring of the plug connector 170.

Figure 19:
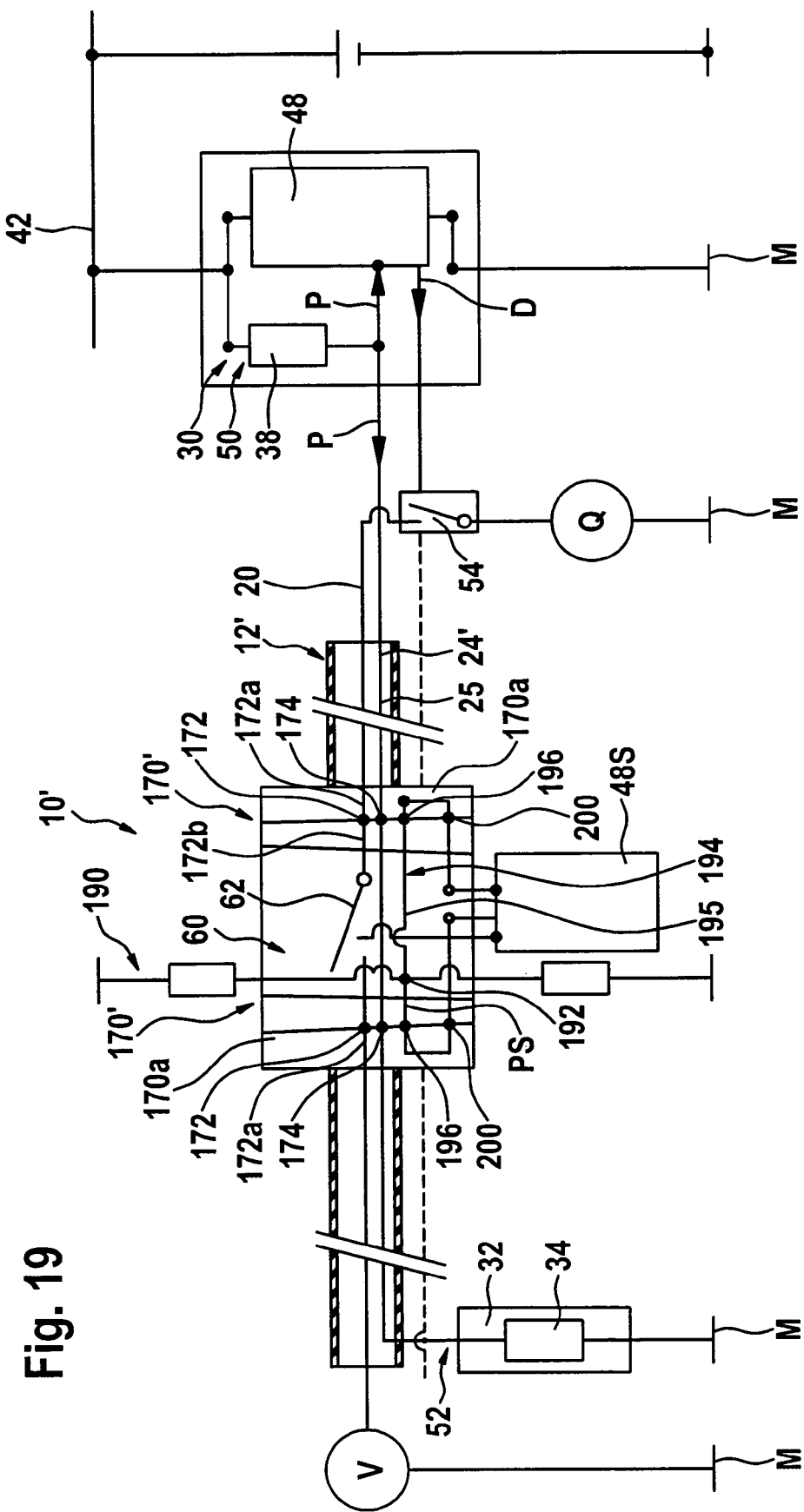
FIG. 19 shows a circuit diagram of a fifteenth embodiment.

In a fifteenth embodiment, illustrated in FIG. 19, which is based on the idea of the thirteenth embodiment according to FIG. 17, the detector line system 24' is guided through the plug connector 170' via the plug contact 174.

In addition, the control device 60 has its own voltage divider 190 allocated to it, at the central tap 192 of which its own test signal PS can be generated.

This test signal PS is guided from the control device 60 via a monitoring line system 194 comprising a monitoring line 195, plug contacts 196 and a loop 196 in the plug connector element 170a as well as plug contacts 200 to separate inputs 202 and 204 to the monitoring circuit 48S, wherein the plug contacts 196 are designed in accordance with the plug contacts 172 and the plug contacts 200 are designed in accordance with the plug contacts 174.

As soon as the plug connectors 170' are not correctly connected, there is no electrically conductive connection to the plug contacts 200 and, therefore, the monitoring circuit 48S switches the load device V off via the switch 62 for such a time until the test signal PS is likewise detected by the monitoring circuit 48S at both inputs 202 and 204.

One embodiment of a plug connector 170 is illustrated in FIGS. 20 to 23 in its individual functional positions.

Figure 20:
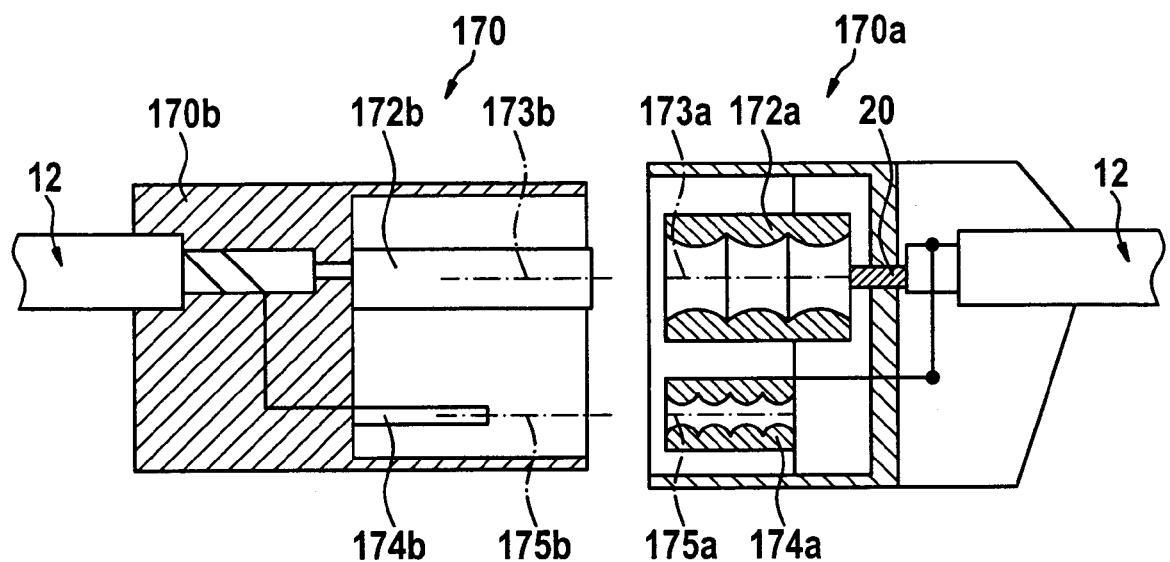
FIG. 20 shows a longitudinal section through a plug connector with disconnected plug connector elements preferably used in the twelfth, thirteenth and fourteenth embodiments.

As is apparent from FIG. 20, the plug connector 170 comprises in the plug connector element 170a a contact element 172a which is designed as a sleeve and is dimensioned such that it can be pushed onto the contact element 172b which is of a cylindrical design.

Furthermore, the contact element 174a arranged in the plug connector element 170a is also of a sleeve-like design and can be pushed onto the contact element 174b which is of a cylindrical design, wherein the contact elements 172a and 174a are aligned parallel to one another with their central axes 173a and 175a and, in addition, the contact elements 172b and 174b are likewise aligned parallel to one another with their central axes 173b and 175b and the central axes 173a and 175a as well as 173b and 175b have the same respective distance from one another.

Figure 21:
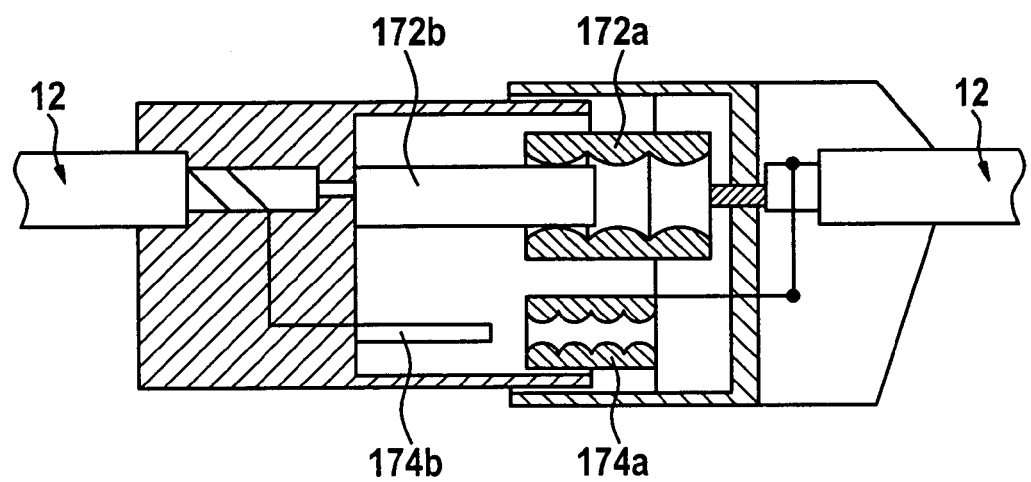
FIG. 21 shows a section similar to FIG. 20 at the beginning of the plugging together of the plug connector elements and provision of an electrical contact between power contact elements.

If the contact elements 172a and 172b are, therefore, aligned flush with one another with respect to their central axes 173a and 173b and, in addition, the contact elements 174a and 174 are also aligned flush with one another with respect to their central axes 175a and 175b, the contact elements 172a and 172b may be brought into contact first of all, as illustrated in FIG. 21, while the contact elements 174a and 174b still have no contact since the extension of the contact element 174b in the direction of its central axis 175b is smaller than that of the contact element 172b.

As a result, an electrical contact is generated first of all only between the contact elements 172a and 172b connected to the line harness 20.

Figure 22:
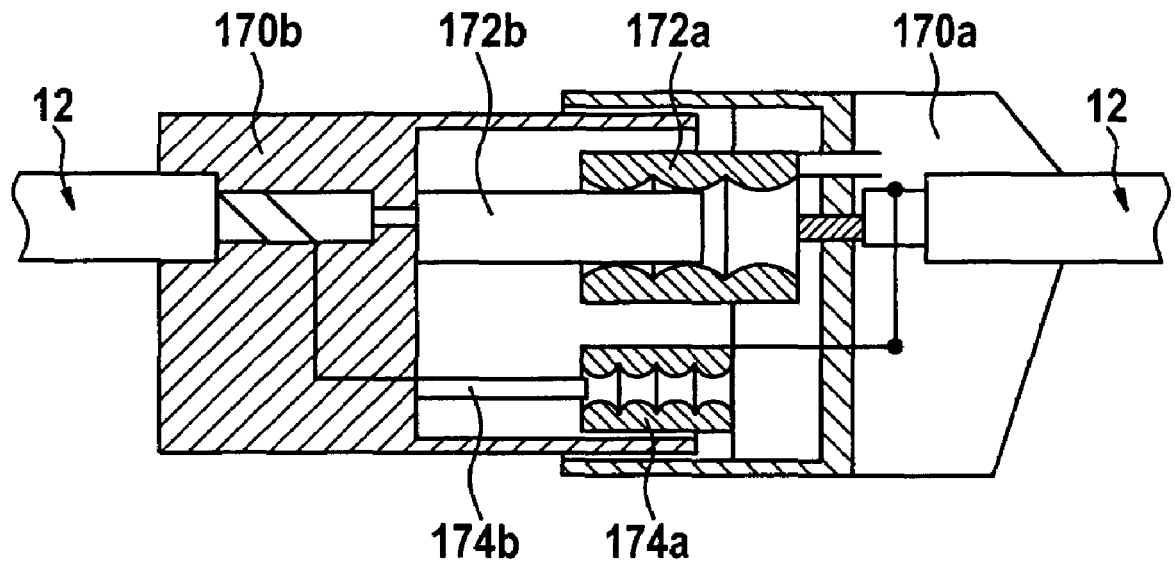
FIG. 22 shows a section similar to FIG. 20 during continued plugging together of the plug connector elements with an existing electrical contact between power contact elements and beginning electrical contact between monitoring contact elements.
Figure 23:
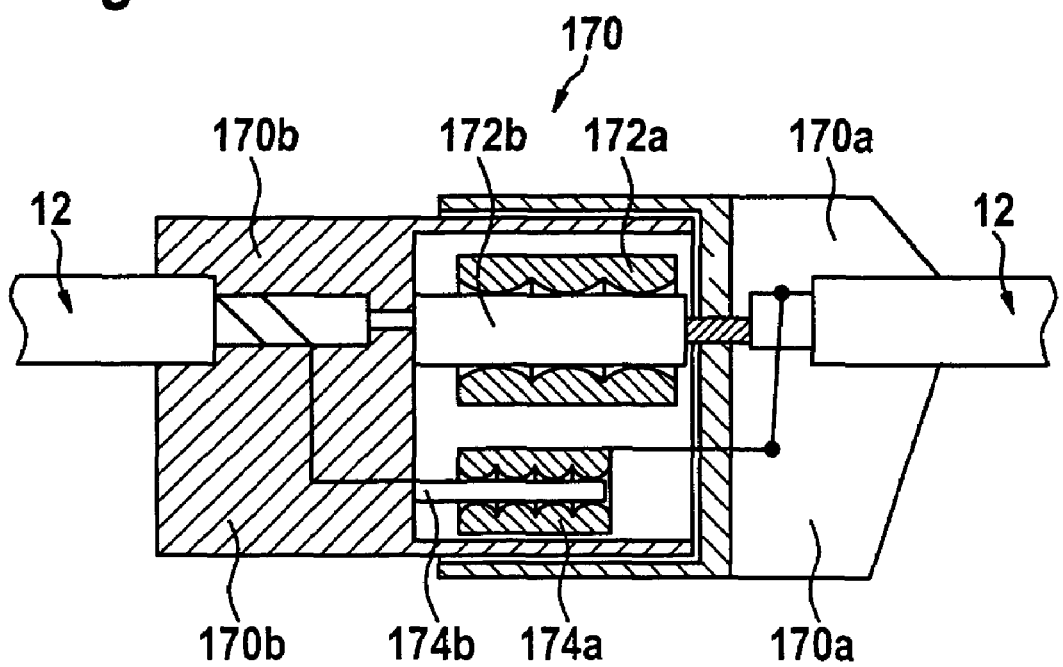
FIG. 23 shows an illustration of the plug connector elements completely plugged together and FIG. 24 shows a schematic section through an additional plug connector usable, for example, in connection with the fifth embodiment according to FIG. 6.
Figure 24:
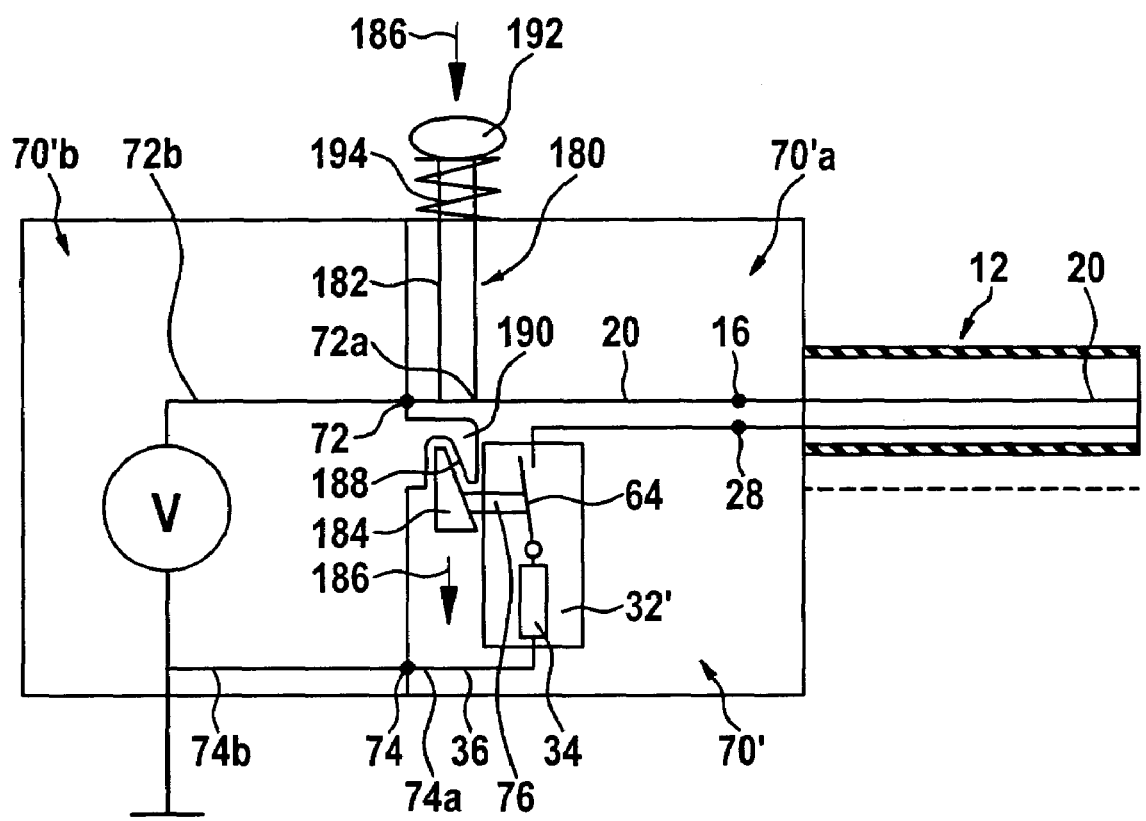

With further displacement towards one another, as illustrated in FIG. 22, a first electrical contact may be generated between the contact elements 174a and 174 only when a sufficiently stable contact already exists between the contact elements 172a and 172b and when the plug connector elements 170a and 170b are completely pushed together, a long-term stable contact exists between the contact elements 172a and 172b as well as 174a and 174b, as illustrated in FIG. 23.

In the same way, during the disconnection of the plug contact elements 170a and 170b from one another, a disconnection is brought about, first of all, between the contact elements 174a and 174b, as illustrated in FIGS. 22 and 21, and only thereafter a disconnection between the contact elements 172a and 172b.

In an additional embodiment of a plug connector 70' which can be used in the case of the fifth embodiment according to FIG. 6, the switch 64, which can be actuated via the mechanical plunger 76, is likewise arranged in the plug connector element 70'a.

In this embodiment, the switch does not, however, sample the secure seat of the plug connector elements 70'a and 70'b relative to one another but rather samples a locking device which is designated as a whole as 180 and comprises a sliding locking bar 184 which can be actuated via a slide 182 and is mounted in the plug connector element 70'a so as to be displaceable in a direction of displacement 186 with the slide 182.

The sliding locking bar 184 is in a position to engage in a locking bar recess 188 of a projection 190 of the contact connector element 70b in order to connect the contact connector elements 70'a and 70'b mechanically to one another in a secure manner. In this respect, the switch 64 is closed via the plunger 76 when the sliding locking bar 184 engages in the locking bar recess 188 so that the plug connector elements 70'a and 70'b are connected mechanically to one another in a secure manner.

If, however, the sliding locking bar 184 is displaced in the direction of displacement 186 due to actuation of the slide 182 and disengages from the locking bar recess 188, the switch 64 is no longer held in its closed position via the plunger 76 but rather the switch 64 opens.

The opening of the switch 64 results in the monitoring circuit 48 generating the defect signal D and, therefore, disconnecting the current feed-in connection 14 from the current source Q by means of the disconnection circuit 54 so that the line harness 20 is no longer current-carrying, as has been described in detail in conjunction with the fifth embodiment and the other preceding embodiments.

The slide 182 can be actuated in the most varied of manners.

The slide 182 can be actuated preferably via a slide head 192 which is acted upon with pressure by a spring 194 and is held by this spring in a position which causes the sliding locking bar 184 to attempt to remain in engagement with the locking bar recess 188 unless any manual action on the slide head 192 counteracts the spring 194.

In the case of this plug connector 70', the contacts 72 and 74 can also be preferably designed and arranged in accordance with the contact elements 172 and 174, described in conjunction with FIGS. 20 to 23, and so, in addition, the contact elements 72a and 72b form an electrically conductive connection with one another first of all when the plug connector elements 70'a and 70'b are plugged together before the contact elements 74a and 74b come into electrical connection with one another.

Furthermore, with this design of the contact elements 72 and 74 it is also provided in the case of the disconnection of the plug connector elements 70'a and 70'b that a disconnection of the electrical connection between the contact elements 74a and 74b is brought about first of all before any electrical disconnection of the contact elements 72a and 72b takes place.

As a result, it may be ensured, in addition, due to such a design and arrangement of the contact elements 72a and 72b as well as 74a and 74b in accordance with the contact elements 172a and 172b as well as 174a and 174b that additional safety is provided during the plugging together of the plug connector elements 70'a and 79'b irrespective of the position of the switch 64.

As for the rest, reference is made in full to the comments in conjunction with the preceding embodiments with respect to the description of the parts and the functioning of this plug connector 70'.

The invention claimed is:

1. Electrical supply network for on-board electrical systems of vehicles, comprising:
    at least one network system with a current feed-in connection;
    at least one load connection; and
    a supply line system leading from the current feed-in connection to the at least one load connection, said supply line system having at least one current-carrying line harness and at least one protective shielding surrounding the line harness;
    the supply line system being provided with a detector line system connected at a first end to a detector circuit and connected at at least one additional end to an end element, the detector line system comprising a line system which is separate from the current-carrying line harness,
    the detector circuit generating a test signal influenced in a defect-free state by the detector line system and the end element, and
    the detector circuit detecting a defect in the supply line system due to deviation of the test signal from a reference value range corresponding to the defect-free state.

2. Supply network as defined in claim 1, wherein the detector circuit triggers a disconnection of the supply line system from a current source when a defect is detected.

3. Supply network as defined in claim 2, wherein the detector circuit activates a disconnection circuit for the separation of the supply line system from the current source.

4. Supply network as defined in claim 1, wherein each additional end of the detector line system is provided with an end element.

5. Supply network as defined in claim 1, wherein the detector line system extends in an electrically insulated manner in relation to the current-carrying line harness and essentially follows the current-carrying line harness.

6. Supply network as defined in claim 5, wherein the detector line system extends along the current-carrying line harness.

7. Supply network as defined in claim 5, wherein the detector line system extends essentially around the current-carrying line harness.

8. Supply network as defined in claim 1, wherein the end element comprises an electrical resistor.

9. Supply network as defined in claim 1, wherein the end element comprises an electrical switch.

10. Supply network as defined in claim 9, wherein the electrical switch serves as a status indicator for defects of a connection of the supply line system to subsequent units.

11. Supply network as defined in claim 9, wherein the electrical switch is mechanically controllable.

12. Supply network as defined in claim 9, wherein the electrical switch is electrically controllable.

13. Supply network as defined in claim 12, wherein the electrical switch is controllable by a detector circuit of a subsequent supply line system.

14. Supply network as defined in claim 1, wherein the detector circuit detects with the test signal an electrical resistance determined by the detector line system and the end element.

15. Supply network as defined in claim 14, wherein the detector circuit detects the electrical resistance in relation to ground.

16. Supply network as defined in claim 14, wherein the end element is located between the additional end of the detector line system and ground.

17. Supply network as defined in claim 1, wherein the test signal is adapted to be generated by a voltage divider.

18. Supply network as defined in claim 17, wherein the end element is an element of the voltage divider.

19. Supply network as defined in claim 17, wherein the detector line system is an element of the voltage divider.

20. Supply network as defined in claim 17, wherein the detector circuit comprises a first branch of the voltage divider for generating the test signal, said branch leading from the first end of the detector line system to a voltage supply.

21. Supply network as defined in any one of claims 17, wherein the end element and the detector line system form a second branch of the voltage divider.

22. Supply network as defined in claim 21, wherein the second branch of the voltage divider is located between the first end of the detector line system and ground.

23. Supply network as defined in claim 17, wherein the detector circuit monitors as the test signal a voltage at the first end of the detector line system.

24. Supply network as defined in claim 23, wherein the detector circuit detects with a monitoring circuit when voltage thresholds are exceeded or not reached.

25. Supply network as defined in claim 1, wherein the test signal is a direct voltage signal.

26. Supply network as defined in claim 25, wherein the test signal comprises several direct voltage potentials.

27. Supply network as defined in claim 26, wherein the direct voltage potentials are applied one after the other.

28. Supply network as defined in claim 26, wherein a changeover between the direct voltage potentials takes place at least during a monitoring period of time.

29. Supply network as defined in claim 26, wherein a monitoring circuit evaluates differences between the direct voltage potentials.

30. Supply network as defined in claim 26, wherein a monitoring circuit evaluates a course of the direct voltage potentials.

31. Supply network as defined in claim 30, wherein a monitoring circuit evaluates flanks during any change in the direct voltage potentials.

32. Supply network as defined in claim 26, wherein the test signal is a high frequency alternating voltage signal.

33. Supply network as defined in claim 32, wherein a monitoring circuit evaluates frequency components of the test signal.

34. Supply network as defined in claim 33, wherein the monitoring circuit detects the frequency components via band filters.

35. Supply network as defined in claim 1, wherein the test signal is an alternating voltage signal.

36. Supply network as defined in claim 1, wherein the detector line system and the at least one end element form elements of an oscillating circuit.

37. Supply network as defined in claim 1, wherein the detector circuit has a monitoring circuit with a learning mode, the reference value range for the test signal being determinable in said learning mode.

38. Supply network as defined in claim 37, wherein the monitoring circuit determines the reference value range proceeding from a measurement value for the test signal in the case of a defect-free detector line system with the at least one end element.

39. Supply network as defined in claim 37, wherein the reference value range is ascertainable by means of a reference value, bandwidth generated by the monitoring circuit.

40. Electrical supply network for on-board electrical systems of vehicles, comprising:
- at least one network system with a current feed-in connection;
- at least one load connection; and
- a supply line system leading from the current feed-in connection to the at least one load connection, said supply line system having at least one current-carrying line harness and at least one protective shielding surrounding the line harness;
- the supply line system being provided with a detector line system connected at a first end to a detector circuit and connected at at least one additional end to an end element,
- the detector circuit generating a test signal influenced in a defect-free state by the detector line system and the end element,
- the end element influencing the test signal to a greater extent than the detector line system, and
- the detector circuit detecting a defect due to deviation of the test signal from a reference value range corresponding to the defect-free state.

41. Supply network as defined in claim 40, wherein the end element influences the test signal to a greater extent than the detector line system by at least a factor of ten.

42. Supply network as defined in claim 40, wherein the end element influences the test signal to a greater extent than the detector line system by at least a factor of 50.

43. Electrical supply network for on-board electrical systems of vehicles, comprising:
- at least one network system with a current feed-in connection;
- at least one load connection;
- a supply line system leading from the current feed-in connection to the at least one load connection, said supply line system having at least one current-carrying line harness and releasable power contact elements for the current-carrying line harness;
- a monitoring line system having at least one monitoring line and releasable monitoring contact elements in the monitoring line, said monitoring contact elements being coupled to the power contact elements in such a manner that a release of the monitoring contact elements takes place with a release of the power contact elements; and
- a monitoring circuit for monitoring the monitoring, line system by means of a test signal and interrupting a flow of current through the current-carrying line harness by means of a switch-off device when monitoring contact elements are released.

44. Supply network as defined in claim 43, wherein the monitoring contact elements are arranged in such a manner that the power contact elements are releasable only when the monitoring contact elements are already contact-free in relation to one another.

45. Supply network as defined in claim 43, wherein the monitoring contact elements mechanically block any release of the power contact elements in their contact-making position.

46. Supply network as defined in any one of claims 43, wherein the monitoring contact elements are elements of a plug contact.

47. Supply network as defined in claim 43, wherein the power contact elements are elements of a plug contact.

48. Supply network as defined in claim 43, wherein one of the respective power contact elements and one of the respective monitoring contact elements are arranged in one plug connector element and the other one of the power contact elements and the other one of the monitoring contact elements are arranged in the other plug connector element of a plug connector.

49. Supply network as defined in claim 43, wherein the monitoring circuit monitors a mechanical connection of the plug connector elements and interrupts a flow of current through the current-carrying line harness by means of a switch-off device when a mechanical connection is released.

50. Supply network as defined in claim 49, wherein the monitoring circuit monitors a locking device of the plug connector elements.

51. Supply network as defined in claim 43, wherein the monitoring line system is formed by a detector line system.

52. Supply network as defined in claim 43, wherein the detector line system is connected at a first end to a detector circuit and connected at at least one additional end to an end element.

53. Electrical supply network for on-board electrical systems of vehicles, comprising:
- at least one network system with a current feed-in connection;
- at least one load connection;
- a supply line system leading from the current feed-in connection to the at least one load connection, said supply line system having at least one current-carrying line harness and releasable power contact elements for the current-carrying line harness;
- a monitoring line system having at least one monitoring line and releasable monitoring contact elements in the monitoring line, said monitoring contact elements being coupled to the power contact elements in such a manner that a release of the monitoring contact elements takes place with a release of the power contact elements;
- a monitoring circuit for monitoring a mechanical connection of the plug connector elements; and
- a switch-off device for interrupting a flow of current through the current-carrying line harness when the mechanical connection is released.

* * * * *

UNITED STATES PATENT AND TRADEMARK OFFICE
CERTIFICATE OF CORRECTION

PATENT NO.       : 7,479,710 B2
APPLICATION NO.  : 11/031474
DATED            : January 20, 2009
INVENTOR(S)      : Flock et al.

Page 1 of 1

It is certified that error appears in the above-identified patent and that said Letters Patent is hereby corrected as shown below:

On the Title page of the patent, the Patent Term Adjustment is corrected to read:

(*) Notice: Subject to any disclaimer, the term of this patent is extended or adjusted under 35 U.S.C. 154(b) by 302 days.

Signed and Sealed this

Fourteenth Day of April, 2009

JOHN DOLL
*Acting Director of the United States Patent and Trademark Office*